(12) United States Patent
De Jaeger et al.

(10) Patent No.: US 10,975,581 B2
(45) Date of Patent: Apr. 13, 2021

(54) SET OF FLOOR PANELS AND METHOD FOR COMPOSING THEREOF

(71) Applicant: UNILIN, BV, Wielsbeke (BE)

(72) Inventors: Jasper De Jaeger, Deinze (BE); Kristof Vangeenberghe, Bavikhove (BE); Bram Verschatse, Roeselare (BE); Mark Cappelle, Staden (BE)

(73) Assignee: UNILIN BV, Wielsbeke (BE)

( * ) Notice: Subject to any disclaimer, the term of this patent is extended or adjusted under 35 U.S.C. 154(b) by 0 days.

(21) Appl. No.: 16/464,931

(22) PCT Filed: Nov. 30, 2017

(86) PCT No.: PCT/IB2017/057530
§ 371 (c)(1),
(2) Date: May 29, 2019

(87) PCT Pub. No.: WO2018/100526
PCT Pub. Date: Jun. 7, 2018

(65) Prior Publication Data
US 2019/0309526 A1   Oct. 10, 2019

(30) Foreign Application Priority Data

Dec. 1, 2016 (BE) .................................. 2016/5900
May 8, 2017 (BE) .................................. 2017/5322

(51) Int. Cl.
*E04F 15/02* (2006.01)
*B44C 3/12* (2006.01)
*B44C 5/04* (2006.01)

(52) U.S. Cl.
CPC .......... *E04F 15/02038* (2013.01); *B44C 3/12* (2013.01); *B44C 3/123* (2013.01);
(Continued)

(58) Field of Classification Search
CPC . E04F 15/02; E04F 15/02038; E04F 2203/02; E04B 5/48; E01F 9/635
(Continued)

(56) References Cited

U.S. PATENT DOCUMENTS 4,212,348 A * 7/1980 Kobayashi ................ F24D 3/14
165/49
5,497,826 A * 3/1996 Ingram ................ F24D 13/022
165/56
(Continued)

FOREIGN PATENT DOCUMENTS

DE         10038886 A1    2/2002
DE    102007006631 A1    8/2007
(Continued)

OTHER PUBLICATIONS

"Laminate Floor Coverings—Specifications, requirements, and test methods," European Committee for Standardization, European Standard, Jun. 2000, 27 pages.
(Continued)

*Primary Examiner* — Paola Agudelo
(74) *Attorney, Agent, or Firm* — Workman Nydegger

(57) ABSTRACT

A set of floor panels is intended for installing a floor in a room. The set comprises a plurality of first floor panels having a common shape and dimension, and one or more second floor panels showing an adaptation of the common shape and/or the common dimension. The adaptation is performed corresponding to the aforementioned room. A method for composing such set of floor panels.

20 Claims, 14 Drawing Sheets

(52) U.S. Cl.
CPC .......... *B44C 5/04* (2013.01); *E04F 2201/0115* (2013.01); *E04F 2203/02* (2013.01)

(58) Field of Classification Search
USPC ...................................................... 52/390, 98
See application file for complete search history.

(56) References Cited

U.S. PATENT DOCUMENTS

| | | | | |
|---|---|---|---|---|
| 5,755,068 | A * | 5/1998 | Ormiston | B32B 3/30 52/314 |
| 6,119,423 | A * | 9/2000 | Costantino | B44C 5/043 52/313 |
| 7,829,176 | B2 * | 11/2010 | Sjoberg | B32B 5/16 428/151 |
| 7,877,956 | B2 * | 2/2011 | Martensson | E04F 15/04 52/581 |
| 8,307,597 | B2 * | 11/2012 | Tucker, Jr. | E04F 15/022 52/403.1 |
| 2003/0200713 | A1 * | 10/2003 | McStay | E04F 15/08 52/311.2 |
| 2004/0035077 | A1 * | 2/2004 | Martensson | E04F 15/10 52/578 |
| 2004/0159066 | A1 * | 8/2004 | Thiers | B44C 5/0469 52/578 |
| 2005/0166516 | A1 * | 8/2005 | Pervan | B27F 1/02 52/589.1 |
| 2006/0032168 | A1 * | 2/2006 | Thiers | E04F 15/02 52/390 |
| 2012/0156432 | A1 * | 6/2012 | Gerbl | B44C 5/0469 428/151 |
| 2012/0240500 | A1 * | 9/2012 | Bjorkman | E04B 5/48 52/302.1 |
| 2014/0202108 | A1 * | 7/2014 | Engstrom | E04F 15/102 52/588.1 |

FOREIGN PATENT DOCUMENTS

| | | |
|---|---|---|
| EP | 1437456 A1 | 7/2004 |
| WO | 9747834 A1 | 12/1997 |
| WO | 0147717 A1 | 7/2001 |
| WO | 0175247 A1 | 10/2001 |
| WO | 2009122332 A1 | 10/2009 |
| WO | 2014195281 A1 | 12/2014 |

OTHER PUBLICATIONS

International Search Report from PCT Application No. PCT/IB/2017/057530, dated Feb. 6, 2018.
Belgian Search Report from BE Application No. 201705322, dated Oct. 23, 2017.
Belgian Search Report from BE Application No. 201605900, dated Aug. 1, 2017.

* cited by examiner

SET OF FLOOR PANELS AND METHOD FOR COMPOSING THEREOF

BACKGROUND

1. Field of the Invention

This invention relates to a set of floor panels and to a method for composing such set.

More particularly, the invention relates to a set of floor panels intended for installing a floor in a specific room.

2. Related Art

Floor coverings which are composed of floor panels in the meantime have become widely known, for example, from WO 97/47834. The floor panels disclosed there relate to, amongst others, laminate floor panels, wherein these are provided with mechanical coupling parts at their edges, which coupling parts allow composing the laminate floor panels to a continuous floating floor covering. The floor panels of WO 97/47834 enable the average do-it-yourselfer to install a floor covering himself, primarily in that the gluing together of the panels is not necessary with this kind of floor panels. The supplied floor panels all have a common shape and dimension, and installing them indeed requires a certain manual skill and expertise for smoothly adapting the floor panels to the room to be provided with a floor, for example, at the beginning or end of a row of floor panels, for the last row, or there, where special situations occur, for example, in order to allow the passage of utility conduits. Moreover, a good installation has to fulfill certain conditions, such as minimum dimensions of the start and end panels of a row, minimum distance between short edges of floor panels in adjacent rows, a sufficiently large expansion joint at the walls, and the like. The size of the expansion joint often depends on the kind of floor covering and/or the geographical region where the room to be provided with a floor covering is situated. Not fulfilling one or more of these conditions may lead to a loss of the warranty and to a defect floor. Performing the adaptations necessary for the room requires a lot of time and leads to noise and dust, which for the time being is considered a necessary inconvenience. It must also be noted that there is a market trend towards floor panels of larger dimensions, for example, with a length of 180 centimeters and more, and a width of 20 centimeters and more. This entails that for installing a floor in one and the same room a larger number of adaptations is necessary, too. Often, the required adaptations also are more difficult with larger panels.

From WO 2001/047717, a method is known for manufacturing floor panels wherein a global decor, for example, a world map, extends over a plurality of floor panels. Each of the floor panels is provided with a decor in a digital manner, such that the esthetic desires of the user can be fulfilled. In view of a smooth installation, the floor panels can be provided with an identification mark. However, the installation still requires the herein above-described adaptations.

From WO 2014/195281, a method is known wherein veneers, intended for the top layer of veneer floor panels, are cut out of wood in an optimum manner. The edges of the veneers more or less follow the natural curvature of the wood, however, are adapted to form, together with similar veneers, a predetermined floor surface. The contours of the veneers are determined by means of a computer program which starts from the floor surface of a room to be provided with a floor and which takes certain preconditions into account, for example, in respect to the minimum distance between short edges of veneers in adjacent rows. The obtained veneers are glued onto a similarly formed substrate, such as a particle board, wherein floor panels with an irregular shape are obtained, which nevertheless provide a complete and closed floor surface for the respective room. The floor panels all are provided with a label. The method of WO'281 is cumbersome and, for example, does not offer a solution in the case of utility conduits to be passed through, or in the case that other solid objects are present in the room, such as support posts, walls or heavy solid made-to-measure furniture.

SUMMARY

The present invention primarily aims at an alternative set of floor panels intended for installing a floor in a room, wherein, according to various preferred embodiments, a solution is offered to one or more of the problems with floor coverings of the state of the art.

To this aim, the invention, according to its first independent aspect, relates to a set of floor panels suitable for, and preferably intended for, installing a floor in a room, with the characteristic that the set comprises a plurality of first floor panels, wherein these first floor panels show a common shape and dimension, and that the set further comprises one or more second floor panels, which show an adaptation of the common shape and/or the common dimension or are provided to this aim, wherein said adaptation is in accordance with the aforementioned room.

By "set of floor panels intended for installing a floor in a room" is meant that this set is not yet installed, but prefabricated, in particular at least such that the aforementioned second floor panels show the required adaptations or are provided to this aim, and still have to be installed in the respective room.

It is clear that the aforementioned first floor panels possibly indeed may show small differences in shape and dimension as a result of production tolerances or by a difference in climatization, for example, a difference in the relative humidity content in the case of wood-based floor panels. To the person skilled in the art, it is clear that two or more first floor panels still show a common shape or dimension, even in a case in which these first floor panels show differences in the respective dimension or shape, wherein these differences still are within the maximum deviation allowed in the standard of the respective floor type, for example, in the case of laminate floor panels within the maximum allowed deviations of the standard EN 13329.

Further, it is clear that by shape and dimension the shape and dimensions in the plane of the floor panel is meant. Of course, it is preferred that the first floor panels and second floor panels would show the same thickness.

According to the most important example of first floor panels, those are rectangular and preferably oblong floor panels, wherein these first floor panels have both length and width in common. According to this example, the first floor panels have a common rectangular shape with a common length and width dimension. According to another example of first floor panels, those are rectangular and oblong floor panels, wherein these first floor panels only have the width in common and wherein the length either varies randomly or is chosen from a limited set, for example, a set of three different lengths. Random lengths are frequently used with panels for solid parquet. According to this example, the first floor panels have a common rectangular shape with a common width dimension, however, mutually different length dimensions. According to still another example of first floor panels, those are rectangular and oblong floor panels, wherein these first floor panels only have the length in common and wherein the width is chosen from a limited set, for example, a set of three different widths. By means of such floor panels, alternatingly rows of wider and narrower panels can be installed. According to this example, the first floor panels have a common rectangular shape with a common length dimension, however, mutually different width dimensions.

It is clear that it is not excluded that a set of floor panels according to the invention can comprise a plurality of types of first floor panels. So, for example, may the set of floor panels comprise a plurality of first floor panels of a first type having a first, for example, rectangular shape, as well as a plurality of first floor panels of a second type having a second, for example, rectangular shape. Such set can be intended, for example, for realizing a floor covering with a central tile motif consisting of first floor panels of the first type, which at the edges is surrounded by a plank motif consisting of first floor panels of the second type. Preferably, the set of floor panels thus then each time also comprises corresponding second floor panels, namely second floor panels of a first type showing an adaptation of the shape and dimension of the first floor panels of the first type, as well as second floor panels of a second type showing an adaptation of the shape and dimension of the first floor panels of the second type.

In general, it is clear that the dimensions and shape of the first floor panels in the set of the invention are not adapted in any manner, and certainly not in accordance with the room for which they are intended. Possibly, they may indeed be provided with a mark in order to indicate their place in the room.

The first floor panels preferably are standard floor panels, for example, rectangular and oblong floor panels, preferably with a length smaller than 2.5 meters. The mass production of floor panels is adjusted to this shape. Preferably, the width of the panels is between 10 and 25 centimeters and/or the length of the panels is between 80 and 150 centimeters. As the set of floor panels relates to a combination of at least first floor panels with a common shape and dimension, preferably common length and width, with adapted second floor panels, in a rational manner a floor can be offered which is adapted to, and possibly made to measure of, the room concerned.

According to the most preferred embodiment, the aforementioned adaptation relates to an adaptation which is performed beforehand and apart from the actual installation. So, for example, the producer of the floor panels can perform the required adaptations, or the distributor of the floor panels can do this. As will become evident further on, the second floor panels also can only be provided for being adapted, in that they, for example, have a break line, or in that the dividing line suitable for the adaptation is indicated on the floor panel. Within the scope of the invention, thus, this each time relates to break lines or indications which are performed beforehand and apart from the actual installation.

Preferably, the set comprises at least the number of first and second floor panels which are necessary for providing the aforementioned room with a floor, wherein the second floor panels then comprise the necessary adaptations in accordance with the respective room, or are provided for these adaptations.

Preferably, the set of floor panels can be applied for installing a floor in the aforementioned room without any further adaptations.

Preferably, the aforementioned set comprises at least second floor panels, wherein the aforementioned adaptation consists of a shortening in the length and/or the width of the floor panels, or wherein the adaptation comprises such shortening. Floor panels with an adapted length can form the beginning or end of a row, wherein first floor panels are installed between the adapted floor panel at the beginning and the one at the end of the row. Floor panels with an adapted width may serve in a row which is parallel or approximately parallel with a wall. In the case of a rectangular room, this may concern the starting row and/or end row.

For clarity's sake, it is also noted that, in the case that use is made of first floor panels of random length, a second floor panel, which is shortened in length, is different from a first floor panel at least in that such second floor panel lacks edge characteristics at the short edge where the shortening has been performed. So, for example, a possible chamfer, coupling means of other, for example, protruding parts will be omitted at that edge, while this is present indeed in the first floor panels.

Preferably, the aforementioned set comprises at least second floor panels, wherein the aforementioned adaptation consists of entirely or partially removing protruding portions on one or more edges of the floor panels, or wherein the adaptation comprises such removal. This may relate, for example, to removed portions of coupling parts present at the edges, such as a protruding tongue portion or a protruding groove lip portion. According to the state of the art, a floor fitter removes such portions when installing a floor in regard to obtaining a more compact expansion joint, for example, against a wall. So, for a starting row of a floor covering, the protruding tongue portions present on the long edges can be removed.

Preferably, the aforementioned set comprises at least second floor panels, wherein the aforementioned adaptation consists of an adapted contour provided on one or more edges of the floor panel, or wherein the adaptation comprises such adapted contour. Herein, the aforementioned contour can follow the course of a wall or other edge with a part of the aforementioned room which does not have to be provided with a floor. Providing such contour is of interest, for example, with walls which are not or not completely parallel to the long panel edges at the beginning or at the end of the floor installation. Preferably, the adapted contour is such that an expansion joint remains between the adapted contour and the wall. Preferably, the expansion joint has a constant width, or at least a width having a possible variation in its width of less than 40%. So, for example, may the width of the expansion joint be approximately 10 millimeters plus/minus 2 millimeters. Preferably, the width of the expansion joint is adapted in function of the geographical location where the room to be provided with a floor is situated. So, for example, with wood-based flooring products, in northern regions, such as Scandinavia, a drying and thus shrinkage of the floor product in the winter has to be taken into account as the heating in the living spaces will produce a low air humidity. In southern regions, such as Oceania, then a high relative humidity during the summer, and thus ditto expansion of the flooring product, has to be taken into account.

Preferably, the aforementioned set comprises at least second floor panels, wherein the aforementioned adaptation consists of recesses and/or adaptation pieces provided on the respective panel and intended for the passage of conduits, or wherein the adaptation comprises such recesses and/or adaptation pieces. Such recesses and adaptation pieces are desirable, for example, there where heating pipes protrude from the floor surface. Herein, the adaptation piece, for example, is the panel portion situated, seen from the room, behind the heating pipes. When installing the floor, such panel portion or adaptation piece must be installed separately from the actual second floor panel in order to allow working around the respective pipes. Preferably, the adaptation piece is obtained from another standard floor panel than the respective actual second floor panel. In this manner, a perfect connection between the adaptation piece and the actual second floor panel can be obtained, namely without an intermediate distance, created by a saw line or other cutting line between the adaptation piece and the actual second floor panel, will remain. Preferably, the adaptation piece, if obtained from another standard floor panel, is realized such that its decorative side matches the decorative side of the actual second floor panel. According to the most preferred embodiment, the adaptation piece to this aim is obtained from a standard floor panel with an identical decorative side as the standard floor panel of which the actual second floor panel is obtained, and preferably the adaptation piece is taken from that location of the standard floor panel which corresponds to the removed piece of the actual second floor panel, such that the decors of adaptation piece and actual portion of the second floor panel merge into each other seamlessly or practically seamlessly. Floor panels with identical decorative sides typically are present, for example, in flooring products having a printed decor, such as this is the case, for example, with laminate floor panels or LVT floor panels (Luxury Vinyl Tile).

Preferably, said adaptation comprises the removal of an excess portion of the respective floor panel. Herein, this relates to removal which is performed beforehand and apart from the installation. In other words, the respective floor panel is delivered completely to measure in function of the position it will have in the destined room.

According to a particular alternative, said adaptation comprises a break line which is provided between the excess portion and the useful portion of the respective floor panel. Such break line then can allow the final user or installing person a simple removal of the excess portion, for example, without necessitating saw treatments. In other words, the respective floor panel can be brought to measure in a simple manner by means of the provided break line, in function of the position the panel will have in the destined room. Such break line is also provided in the respective second floor panel beforehand and apart from the installation. Preferably, the useful portion and/or the excess portion of the second floor panel is provided with a mark or other indication, such that the user can derive whether the respective portion is useful or redundant.

According to still another alternative, the aforementioned second floor panels comprise an indication according to which the respective second floor panels have to be adapted in order to correspond to the aforementioned room. So, for example, the dividing of the respective floor panel that has to be performed can be indicated by a dividing line provided thereon, and/or the excess portion and/or the useful portion of the floor panel can be marked. Such indication is also provided on the respective floor panel beforehand and apart from the installation.

According to still another alternative, the aforementioned second floor panels comprise an instruction for use, for example, according to which they have to be installed. Herein, this may relate, for example, to an instruction to glue the respective second floor panel to the subsurface, whereas the floor covering for the rest substantially consists of a floating floor covering. This is useful, for example, in the case of thermoplastic floor panels, such as so-called LVT (Luxury Vinyl Tile), at the locations where they can be subjected to direct incident sunlight. It is known that in such situation such panels tend to expand. Herein, the panels then locally bulge out of the floor surface. In order to prevent this, a local gluing of the panels to the subsurface is a good option.

The herein above-mentioned break lines and/or indications are, for example, extremely useful in the case of small excess portions or small useful portions of floor panels. Primarily in the case of small useful portions, the risk of the occurrence of inaccuracies in an automatic production environment is prevalent. There is also a risk of loss of such portions, either in the production or in the installation. Not removing or not completely removing excess portions of the floor panels, but instead indicating dividing lines or providing break lines may also lead to a more stable packaging unit.

A break line, such as in the above-mentioned particular alternative, can be performed in various practical manners, of which herein below, without wanting to be exhaustive, some important possibilities are listed.

According to a first possibility, the break line comprises or consists of a plurality of through-bores which are situated along the desired dividing line between the useful and excess portions of the floor panel. Preferably, at least 60% of the dividing line is formed by such bores. It is clear that such bores do not necessarily have to be cylinder-shaped.

According to a second possibility, the break line comprises or consists of one or more not through-going incisions at the location of the desired dividing line between the useful and excess portion of the floor panel. The not through-going incisions can be performed on the upper side or on the lower side of the floor panel, or on both sides, whether or not alternately along the dividing line. The not through-going incisions may or may not be present over the entire dividing line. Preferably, they are at least present over 80% of the dividing line. According to the most preferred embodiment, such incision is performed at least at the decorative side of the respective floor panel, and preferably the incision extends over the entire respective dividing line. In this manner, at the factory a good cut quality can be provided on the visible surface of the floor panel. The risk that the final removal of the excess portion damages the visible surface of the useful portion then will be minimum. According to an alternative, such incision is performed at least at the lower side of the respective floor panel. Preferably, the thickness of the remaining material portion at the upper side or lower side of the respective floor panel is less than 10% of the thickness of the floor panel. Preferably, the thickness of the remaining material portion on the upper side or the lower side is less than 2 millimeters. Such thickness allows simple removal of the excess portion by means of a cutter and similar tools.

According to a third possibility, the break line comprises or consists of a whether or not through-going slot which substantially extends over the entire dividing line, however, in such a manner that the useful portion still is connected to the excess portion over a remaining portion of one or more coupling parts present at the edges. According to a first example thereof, the break line can extend between positions which are situated on two different edges, for example, opposite edges, proximally from the distal ends of the coupling parts present there. In such case, the distal ends of these coupling parts at the respective edges are not cut through. In this manner, the useful portion remains connected to the excess portion over these distal portions. This may concern, for example, a portion of a protruding groove lip and/or a portion of a tongue protruding at the edge. According to a second example thereof, the break line can extend between different positions at the same edge, wherein these positions each time are situated proximally from the distal end of the coupling part present there. It is clear that the slot, according to this third possibility, preferably extends at least over the entire portion of the dividing line situated on the decorative surface of the floor panel, whereas one or more portions of the floor panel, which protrude at the edge of the decorative surface, remain uninterrupted. The user then may break off the not interrupted distal portions manually or with simple tools, such that the useful portion is separated from the excess portion.

According to a fourth possibility, the break line comprises or consists of a through-going slot, which substantially extends over the entire dividing line, whereas the slot, over a limited portion of the dividing line, for example, less than 10% thereof, is made not through-going. In this manner is obtained that the useful and the excess portions of the floor panel still remain connected at the location of this not through-going portion of the slot. The user then can interrupt the connection manually or with simple tools, such that the useful portion is separated from the excess portion.

In general, it is noted that a break line preferably is realized such that interrupting the remaining connections between the excess portion and the useful portion of the floor panel cannot exert an influence on the decorative side. Preferably, the desired contour of the decorative side is already provided by means of the slots, bores and the like. By an appropriate choice of the break line it can also be provided for that the interruption of the remaining connections does not have an influence on the functioning of the coupling parts, for example, in that the useful portion and the excess portion only remain connected by a portion of the lower side and/or of the core of the floor panel which is situated outside of the profile of the coupling parts, for example, by a centrally situated portion of the core and/or of the lower side of the panel.

It is clear that the set of floor panels of the first aspect can comprise various types of second floor panels, for example, floor panels from which the excess portion is removed, floor panels from which the excess portion is provided over a break line with the useful portion, and/or floor panels with the indication of a dividing line necessary for the separation of the useful and the excess portion. It is also possible that one and the same floor panel comprises a removed portion, a break line and/or an indication.

Preferably, a plurality of the aforementioned floor panels showing an adaptation or being provided to this aim, are packaged together in a packaging unit. In the case that the adaptation comprises a removal of the excess portion, it is advantageous that the respective unit also comprises one or more excess portions created by said adaptation or removal. In this manner, a stable stacking of second floor panels in a packaging unit can be obtained.

The invention of the first aspect is particularly useful with floor panels which are suitable for forming a floating floor covering. Such floor panels are particularly suitable for being installed by do-it-yourselfers, however, still require specific adaptations, such as the adaptations connected to providing sufficiently large expansion joints. Floor panels for a floating floor covering preferably comprise coupling parts on at least two opposite edges, which coupling parts allow connecting two of such floor panels to each other, wherein at the respective edges a locking is created in a direction perpendicular to the plane of the coupled panels, as well as in a direction in the plane of the panels and perpendicular to the respective edge. Such coupling parts can be realized, for example, as a locking tongue-in-groove connection, for example, of the type such as known from WO 97/47834. Such coupling parts usually also comprise protruding portions on one or more of the aforementioned edges. In such case, an adaptation is desirable wherein in a number of said floor panels these protruding portions on one or more edges are removed, or are provided for being removed.

With the same aim as in the first aspect, the present invention, according to an independent second aspect, also relates to a method for composing a set of floor panels for installing a floor in a room, wherein the method comprises the steps of generating a data set corresponding at least to the surface area of said room, establishing an installation plan suitable for said room, producing the required second floor panels, which, according to the established installation plan, comprise an adaptation or are provided to this aim, and, preferably, providing at least the required quantity of first floor panels with common shape and dimension, or dimensions. It is clear that the method of the second aspect preferably is applied for realizing a set of floor panels with the characteristics of the first aspect or the preferred embodiments thereof.

Generating the aforementioned data set in accordance with at least the surface area of said room preferably is performed by means of an automatic measuring device. Herein, this may relate to a measuring device which scans the room and in this manner, for example, generates a cloud of points comprising at least a two-dimensional image of a portion of the surface area plan of the room. The respective measuring device can perform its measurements possibly from different positions in the respective room, and/or from different points of view, for example, according to the visibility of the walls of the respective room. The different clouds of points created thereby are referred to each other by means of the taken position and point of view, such that a complete image of the surface area of the respective room, and more particularly of the walls thereof, is created. This complete image is digitally stored and forms at least the basis of said data set.

It is clear that establishing the aforementioned installation plan preferably is performed on the basis of said data set, or in other words on the basis of the digital surface area plan.

Practically seen, the aforementioned installation plan can be established in different manners.

According to a first manner, the step of establishing the aforementioned installation plan is performed by means of a computer, wherein the computer, on the basis of said data set, taking desired limitations into account, proposes an installation plan. The desired limitations may be manifold. A first limitation is the dimension and shape of the first, or standard, floor panels. These first floor panels are taken from an available floor product which is chosen by the end user on the basis of personal preference. A second limitation is the type of installation plan. On the basis of his personal preference, the end user may opt for rows in random pattern, rows in half pattern, rows according to the diagonal of the respective room or for special patterns, such as herringbone pattern and the like. Such installation plan preferably as such already fulfills certain conditions, such as the condition of the minimum distance between short edges of panels in adjacent rows. Preferably, the end user also specifies the main direction of the rows or patterns. Preferably, the user also specifies the geographical location of the room to be provided with a floor. Taking into account still further limitations, such as, for example, the minimum dimension of expansion joints required for the respective floor product, this preferably in function of the geographical location of the room, and, for example, the minimum dimension of panels at the beginning or at the end of a row, and on the basis of said data set or digital surface area plan, the computer then will propose a final detailed installation plan which is suitable for installing a floor in the respective room. From this installation plan, the required number of first floor panels, namely floor panels having a common shape and dimension, can be calculated, as well as the number of said second floor panels with their required adaptation. The calculation of the required adaptations is based on determining the intersections/intersection lines between the digital surface area plan and the installation plan. The result of the calculation then can be applied for automatically composing the set of floor panels which is intended for installing a floor in the mentioned room. This automatically composing can comprise, amongst others, producing said second floor panels on the basis of standard panels, similar to the aforementioned first floor panels. This producing may comprise performing one or more of the adaptations, or provisions to this aim, which are mentioned within the scope of the first aspect of the invention. Preferably, by means of the aforementioned calculation CAD/CAM (Computer-Aided Design/Computer-Aided Manufacturing) data for each of the aforementioned second floor panels are created, wherein these data are suitable for controlling a processing machine, such as a routing machine and/or shortening saw and/or laser cutting machine and/or water cutting machine or other cutting apparatus, such that the necessary adaptation, indication and/or break line can be realized.

According to a second manner, the step of establishing the aforementioned installation plan is performed by means of a computer, wherein the computer, on the basis of said data set, taking desired limitations into account, assesses installation plans which were proposed by the user. The desired limitations may be manifold. A first limitation is the dimension and shape of the first, or standard, floor panels. These first floor panels are taken from an available floor product which is chosen by the end user on the basis of personal preference. A second limitation is the type of installation plan. On the basis of his personal preference, the end user may choose a type of installation plan and opt for rows in random pattern, rows in half pattern, rows according to the diagonal of the respective room or for special patterns, such as herringbone pattern and the like. The user can also specify the desired main direction of the rows or patterns. Preferably, the user also specifies the geographical location of the room to be provided with a floor. Such installation plan preferably already fulfills certain conditions, such as the condition of the minimum distance between short edges of panels in adjacent rows. The user then can present the installation plan according to choice for the aforementioned data set, or the digital surface area plan, after which the computer assesses whether the proposal of the user fulfills various further limitations, such as, for example, whether the minimum required dimension of panels at the start or at the end of a row is fulfilled, thereby taking into account the required expansion joint for the chosen floor product and the geographical location of the respective room. If this is not the case, the user can present the installation plan in another manner until it suffices and a final detailed installation plan is found that is suitable for installing the floor of the respective room. The iteration to be performed by the computer, wherein proposals for an installation plan are assessed by the user, can be performed in a user-friendly manner, for example, in that the user provides the chosen type of installation plan in a graphical manner, for example, as a virtual layer which only represents the edges of the panels, over a representation of the aforementioned surface area plan. The user alters the position of the installation plan and/or surface area plan until the computer states that the mutual position is suitable or, in other words, fulfills one or more of the further limitations. Altering the position of the installation plan and/or the surface area plan may take place in various manners, for example, by means of a keyboard, joystick and/or mouse, however, preferably it is performed by means of a touch-activatable screen or touchscreen. According to this last-mentioned possibility, the user, for example, moves the type of installation plan over the surface area plan until the computer states that a suitable mutual position is found. In general, the indication of finding a suitable installation plan can be stated in various manners, for example, by means of signs, colors, sounds, contrasts, vibrations and/or diagrams. Possibly, a difference can be made between acceptable installation plans and ideal installation plans. In the case that the installation plan is presented over the surface area plan in a graphical manner, the installation plan, surface area plan or both can change color when a suitable installation plan is achieved or is close. When the final detailed installation plan, which is suitable for installing a floor in the respective room, is found, the required number of first floor panels, namely floor panels having a common shape and dimension, can be calculated, as well as the number of the aforementioned second floor panels with their required adaptation, such that the set of floor panels can be composed in a similar manner as herein above in the first manner.

When according to the herein above-mentioned first or second manner no suitable installation plan is found, the user will select another type of installation plan. Not finding a suitable installation plan may occur primarily with a random pattern, when in each position of the installation plan somewhere a too short floor panel is present at the beginning or end of a row. The user then may choose for another type of installation plan, wherein this other type then also relates to a random pattern, however, with the difference that the mutual position of panels in adjacent rows is altered, such that with this other type possibly a suitable installation plan can be found indeed.

According to another possibility, the computer, when no suitable installation plan is found according to the herein above-mentioned first or second manner, may propose alterations to the type of installation plan. This may occur primarily there, where the desired limitations are not fulfilled. When, for example, with a random pattern a too short starting panel is present in a certain row, the computer can propose another starting length for this row, such that the adapted installation plan becomes suitable for installing a floor in the respective room.

Of course, the computer can impose additional limitations for a suitable installation plan. So, for example, limitations may be imposed which lead to an improved installation comfort. For example, it is advantageous, in a case in which the end-face seams of the floor panel rows are located perpendicular to a wall with a door opening, to provide for that at least one of these seams is situated at the location of the door opening.

According to the desired ease of application and the desired customer specificity, some steps of the method of the second aspect may or may not be left to the user. For example, establishing the suitable installation plan may be left to the end user. The end user may perform this by means of a computer and suitable software, however, it is also possible that the end user submits his desired type of installation plan and that the suitable final installation plan then is established by the producer, distributor, architect by means of a computer and suitable software. Depending on the steps performed by the end user, it is possible that other data is available for manufacturing the second floor panels. For example, it is possible that the data comprise the digital surface area plan only. It is also possible that the data comprise at least the geometry of each second floor panel.

According to a particular embodiment of the above-mentioned first manner, and in particular in the case of a desired random pattern, it is possible that a computer, on the basis of the aforementioned data set, proposes a detailed installation plan for a certain room. Hereby is meant that one does not necessarily have to start from an installation plan wherein as such certain conditions have been fulfilled already. Establishing such detailed installation plan preferably comprises the following steps:
- the step of determining the main direction of the panel rows, preferably by input by the user, for example, by indicating that the main direction has to be parallel to a portion of the borders of the digital surface area plan, such as this is given in said data set;
- the step of determining the position of the longitudinal edges of panel rows; this step can be performed automatically, preferably such that the average width of the panel rows at the edges is maximum, and wherein the width for each row at such edge over a maximum possible length of the respective row is at least one-half of the width of the panels of the respective floor product;
- the step of calculating intersections between said longitudinal edges of panel rows and the digital surface area plan, more particularly the external, and preferably also the internal, borders of this surface area plan;
- the step of identifying, on the basis of said intersections, starting and stopping positions in panel rows of complete width, as well as of concave and convex loops extending in the same panel row;
- the step of presenting first and second floor panels between the starting and stopping positions in each panel row, taking into account desired limitations and possible concave loops situated in the respective panel row;
- the step of presenting second floor panels at the location of said convex loops, also taking desired limitations into account.

The obtained detailed installation plan then is further applied such as explained in the above-mentioned first manner for composing the set of floor panels which is intended or suitable for installing a floor in the respective room. It is clear that in the step of determining the position of the longitudinal edges of panel rows, in the case of a floor product with panels of two or more widths, the desired variation in the width of the rows, for example, alternatingly wide and narrow rows, has to be taken into account.

As the detailed installation plan is composed row by row, it is possible to have the final installation plan fulfill more extensive limitations. So, for example, it is possible to entirely or partially apply a excess portion of a second floor panel of an earlier composed row as a useful portion in another row which still has to be composed. In this manner, one can work with less loss. According to another example, it can be provided for that a passage of a utility conduit coincides with a pair of transverse panel edges. This considerably increases the ease of installation and offers an esthetical and qualitative result.

The detailed installation plan composed according the above particular embodiment thereof is also applicable in the case that a floor product is used with first floor panels of random length. In such case, there is preferably a database with the length of the available first floor panels. The steps of proposing the suitable panels then can be performed each time starting from an available, probably the most suitable, first floor panel, while taking the individual length of this floor panel into account. From this database, also the most suitable first floor panel can be chosen to be adapted as the required second floor panel. Such method is particularly interesting in the case of parquet panels. Namely, in wood sawmills frequently excess quantities of short wood are available, and parquet manufacturers practically are obliged to take in such short wood. From such wood then usually a less costly product, such as three-stroke parquet, is composed. According to the present invention, such pieces of short wood may be upcycled and form part of the database of first floor panels, such that they can applied, where this is possible, for providing a second floor panel. Working with a database of available first floor panels is also interesting in those cases where the production tolerances can be relevant, for example, when the length of the rows, and thus the number of floor panels in the respective rows, is so large that a no longer acceptable accumulation of panel length tolerances is created. Such principle of database of available first floor panels can also be applied for storing data, for example, the length, in respect to available, originally excess portions of second floor panels. These then may be taken into account for a following second floor panel according to the installation plan being calculated further.

The detailed installation plan composed according to the above-mentioned particular embodiment can result in a very realistic virtual visualization of the room provided with a floor. Possibly, the detailed installation plan can also be adapted in function of the feedback of the user to such visualization.

It is clear that according to the second aspect it is also not strictly necessary that the method has to comprise the step of providing at least the required number of first floor panels with common shape and dimensions, or dimensions. Namely, it is possible that the end user himself provides enough standard panels and makes use of another batch in order to provide one or more of the second floor panels.

Further, it is clear that an installation plan to be established does not necessarily have to be established at once for the entire room to be provided with a floor. So, for example, is it possible that successively partial installation plans are established by means of the above-mentioned first and/or second manner, for example, partial installation plans each time having a width of two or more rows, for example, five or seven rows. It is evident that partial installation plans adjoining each other can also fulfill certain desired limitations, for example, the limitation that the minimum distance between short edges of panels in the adjoining rows of the respective partial installation plans must be shifted over a minimum distance in mutual respect.

According to the first as well as to the second aspect, it is preferred that at least the second floor panels comprise an identification allowing, possibly in connection with an installation plan, to determine their intended position in the floor. Possibly, the first floor panels, too, can be provided with such identification. The identification of first floor panels can be useful in the case that the set of the invention comprises first floor panels with an identical or practically identical decorative side, for example, in the case of floor panels which are provided with a printed decor at their upper surface, for example, with an imitation of wood. The identification can be performed such that it is avoided that such first floor panels are taken up in the floor plan close to each other, which may emphasize that this is an imitation. Also in the case that there is a plurality of types of first floor panels, for example, first floor panels with two or more different shapes and/or dimensions, an identification can be useful in order to guarantee the desired installation pattern. In general, the identification can also represent an installation sequence according to which the floor covering can be installed most simply.

Although the invention of the first and second aspect primarily is intended for being applied with floor coverings which are composed of panel-shaped elements, it is clear that, according to a deviating variant, it can also be applied with floor coverings which are composed of web-shaped elements, such as the webs of wall-to-wall vinyl or wall-to-wall carpeting. According to a particular aspect, the present invention thus also relates to a web-shaped element suitable and preferably intended for installing a floor in a room, characterized in that said web-shaped element comprises an adaptation which is performed in accordance with said room or is provided for such adaptation. For example, the adaptation in particular is in accordance with the course of one or more walls of the respective room. It is clear that the floor covering of the respective room can comprise one or more of such web-shaped elements and that the method of the second aspect, mutatis mutandis, according to a deviating variant, is also suitable for composing the web-shaped elements for installing a floor in a room.

By means of the data set generated within the scope of the method of the second aspect, also accessories for the respective floor product chosen by the user can be provided, such as skirting boards, transition profiles, subfloor and the like. Possibly, the skirting boards, transition profiles and/or the subfloor can also be adapted on the basis of this data set. In the case of skirting boards, also the miter required in the corners of the room can be provided beforehand and apart from the installation.

BRIEF DESCRIPTION OF THE DRAWINGS

With the intention of better showing the characteristics of the invention, herein below, as an example without any limitative character, some preferred embodiments are described, with reference to the accompanying drawings, wherein.

DETAILED DESCRIPTION OF PREFERRED EMBODIMENTS OF THE INVENTION

Figure 1:
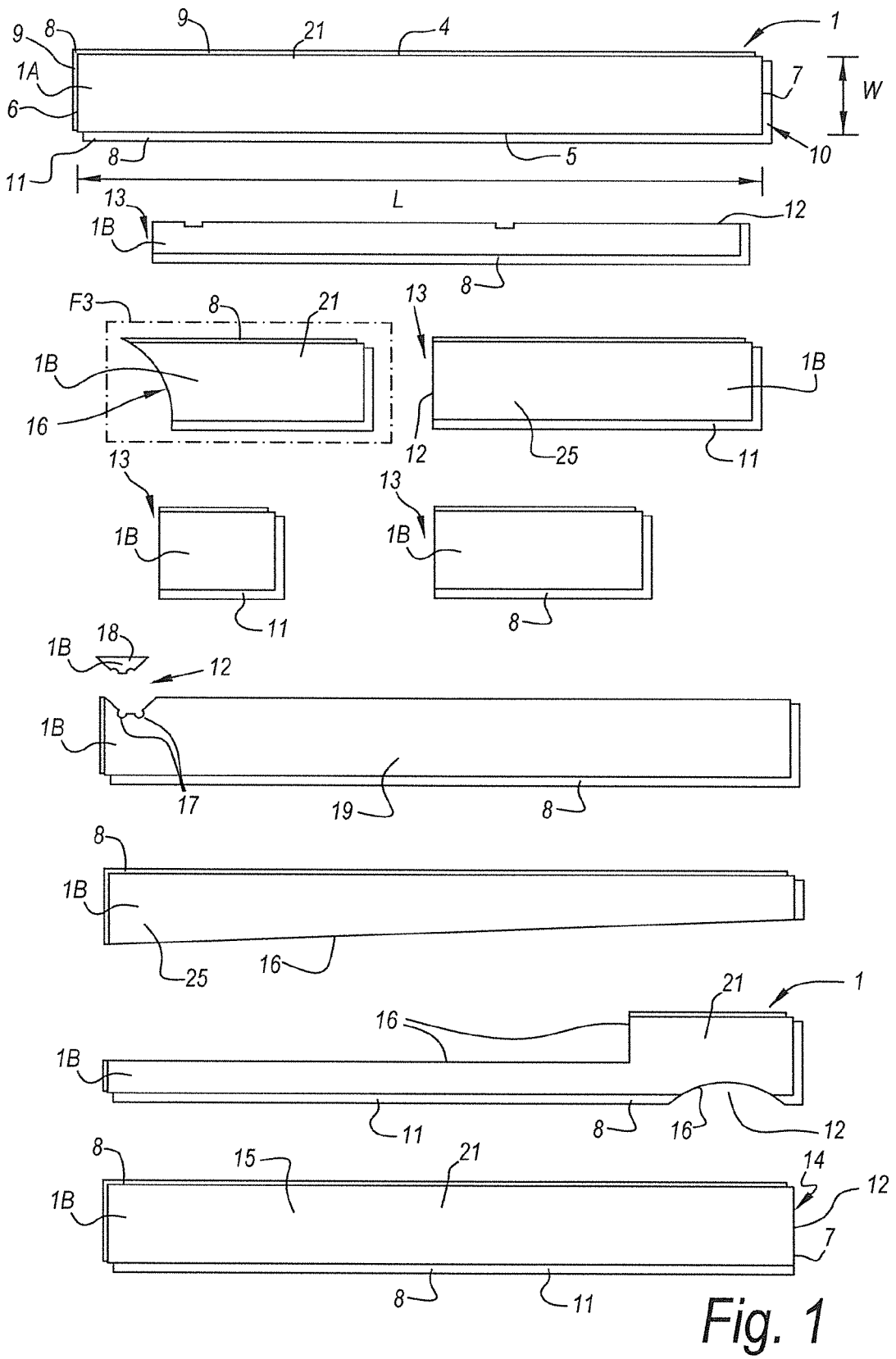
FIG. 1 represents a portion of a set of floor panels with the characteristics of the present invention.
Figure 2:
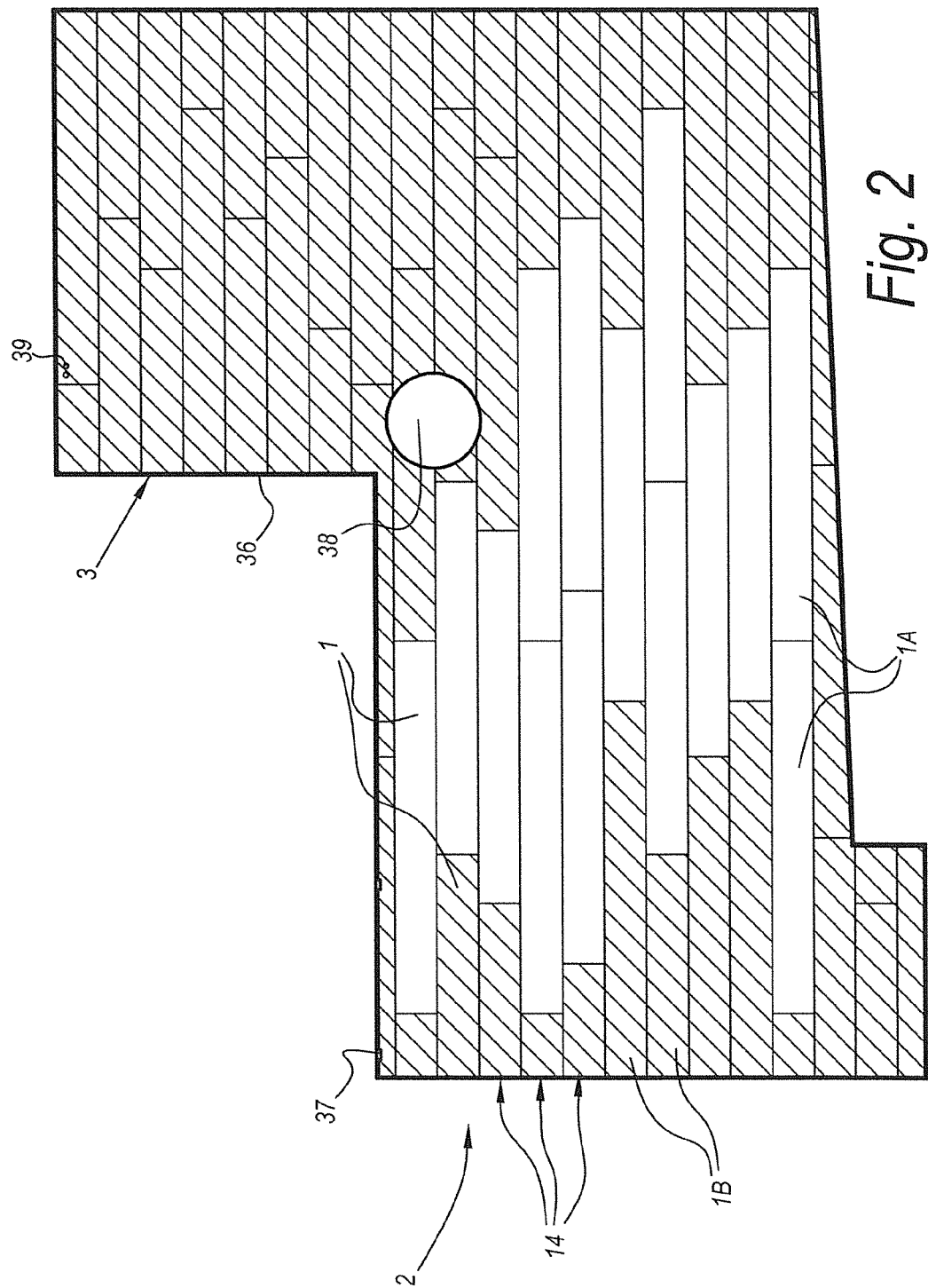
FIG. 2, in top view and at a smaller scale, represents a room which is provided with a floor by means of the set of floor panels of which a part is represented in FIG. 1.

FIG. 1 represents panels 1 of a set of floor panels 2, which, as represented in FIG. 2, is intended for installing a floor in a room 3. The panels 1 of FIG. 1 relate to:

a first floor panel 1A, of which the set comprises a plurality and which show a common shape and dimension. In the example, this relates to floor panels 1A with a rectangular and oblong shape with relatively large dimensions, namely a length L of more than 2 meters and a width W of more than 20 cm. The floor panels 1 are intended for forming a floating floor covering and to this aim are provided at their edges 4-5-6-7 with mechanical coupling parts 8 in the form of a tongue 9 and a groove 10, wherein the groove 10, in the example, has a protruding lower groove lip 11;

a plurality of second floor panels 1B from the aforementioned set 2, which show an adaptation 12 of the common shape and/or the common dimension. The respective adaptation 12 is in accordance with the aforementioned room 3.

The aforementioned first floor panels 1A relate to standard floor panels of a chosen floor product. The aforementioned second panels 1B are obtained by adapting such standard floor panels in accordance with the room 3 to be provided with a floor. In this case, the adaptation 12 each time relates to a removal of the excess portions of the respective floor panel 1B. The adaptation 12 each time is performed beforehand and apart from the actual installation. The set of floor panels 2, of which a portion is represented in FIG. 1, is delivered with the required adaptations 12 or second floor panels 1B.

In the example, the set 2 at least comprises second floor panels 1B, wherein said adaptation 12 comprises a shortening 13 in length. These second floor panels 1B are suitable for forming the beginning or the end of a row 14 of floor panels 1.

In the example, the set 2 comprises at least second floor panels 1B, wherein said adaptation 12 is in the form of a removal 14 of protruding portions at an edge. In the illustrated panel 15, this concerns the removal of the protruding lower groove lip 11 at a short edge 7.

In the example, the set 2 comprises at least second floor panels 1B, wherein said adaptation 12 comprises an adapted contour 16, which is provided on one or more edges. The contour 16 can be adapted to walls 36 and/or other edges of the room 3, such as present pillars 38 or support posts.

In the example, the set 2 comprises at least second floor panels 1B, wherein the adaptation 12 comprises recesses 17 and an adaptation piece 18 intended for the passage of conduits, for example, of pipes for the central heating. Herein, it is possible that the adaptation piece 18 is obtained of another floor panel than the actual portion 19 of this second floor panel 1B. Namely, in this manner it can be avoided that the material removed by a saw line between the actual portion 19 and the adaptation piece 18 would create a seam in the final floor covering. By producing the adaptation piece 18 of another floor panel, a connection with the actual portion 19 of the floor panel 1B can be obtained.

The set 2 of the example comprises at least all first floor panels 1A and second floor panels 1B necessary for providing the respective room 3 with a floor, and in this case the set 2 is performed such that no further adaptations have to be performed for installing a floor in the intended room 3. In general, according to the invention, this is not necessary. The set 2 might comprise as second floor panels 1B only those which comprise an adaptation 12 which goes further than a removal 14 of protruding portions at an edge and/or a straight shortening 13 of the length L of the floor panels 1.

FIG. 2 represents the second floor panels 1B, which are necessary for installing a floor in the respective room 3, in a cross-hatched manner. As here first floor panels 1A with relatively large dimensions compared to the surface of the room 3 are concerned, the second floor panels 1B form more than 50% of the surface.

Figure 3:
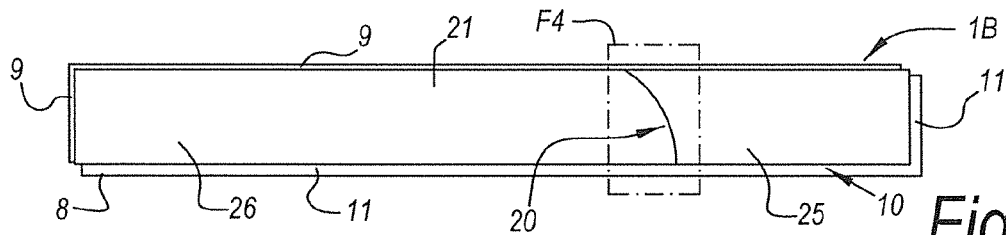
FIG. 3 represents a variant for the panel situated in the area F3 in FIG. 1.

FIG. 3 represents an alternative second floor panel 1B which is provided for being adapted according to an indication 20 provided on the panel, in this case, a dividing line. This dividing line has been provided on the respective floor panel beforehand and apart from the installation. The indication is represented here on the decorative side 21 of the floor panel 1B, however, can also be provided on the lower side thereof. The dividing line or indication 20 can also extend to one or more of the coupling parts 8 provided at the edge.

Figure 4:
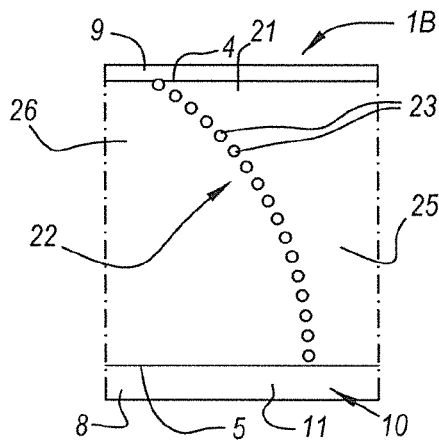
FIGS. 4 to 7, at a larger scale and for variants, represent a view on the area indicated by F4 in FIG. 3.
Figure 5:
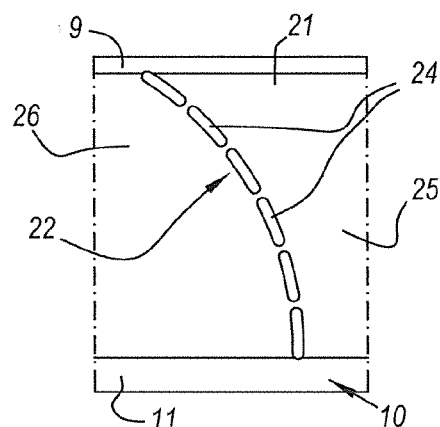

FIG. 4 represents another alternative second floor panel 1B, which is provided for being adapted. To this aim, the panel is provided with a break line 22, which in this case comprises a series of through-bores 23 according to a provided dividing line. FIG. 5 represents an alternative with a plurality of oblong through-slots 24 according to a provided dividing line. It is evident that bores 23 and slots 24 can be combined in order to provide a same break line 22.

Figure 6:
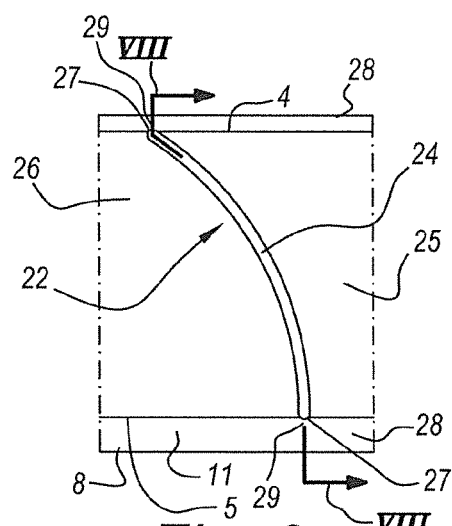
Figure 7:
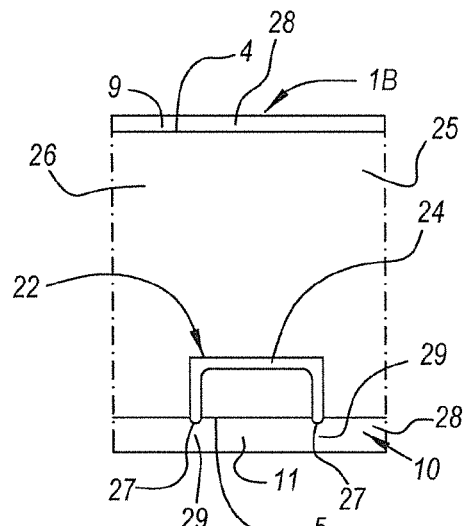

FIG. 6 represents another alternative with only one through-going slot 24 which substantially extends over the entire dividing line. In the example, the useful portion 25 of the floor panel 1B is connected to the excess portion 26 only via the coupling parts 8 of the floor panel 1B. For clarity's sake, FIG. 7 also represents such an example, however, for a different second floor panel 1B, which does not belong to the set 2 of the example. In the example of FIG. 6, the break line 22, as further also illustrated in FIG. 8, extends between positions 27, which are situated at two different edges 4-5, in this case, opposite sides, proximally from the distal ends 28 of the coupling parts 8 present there. In other words, the distal portions 28 of these coupling parts 8 at the respective edges 4-5 are not cut through. In the example of FIG. 7, the break line 22 extends between different positions 27 at the same edge 5, which respectively are situated proximally from the distal end 28 of the coupling part 8 present there. It is clear that the user can break the remaining connection 29 between the useful portion 25 and the excess portion 26 in a simple manner, for example, manually or by means of simple tools. Further, it is clear that with the type of break lines 22 of FIGS. 6, 7 and 8, the useful portion 25 may also be connected to the excess portion 26 over a single remaining connection 29, too.

Figure 8:
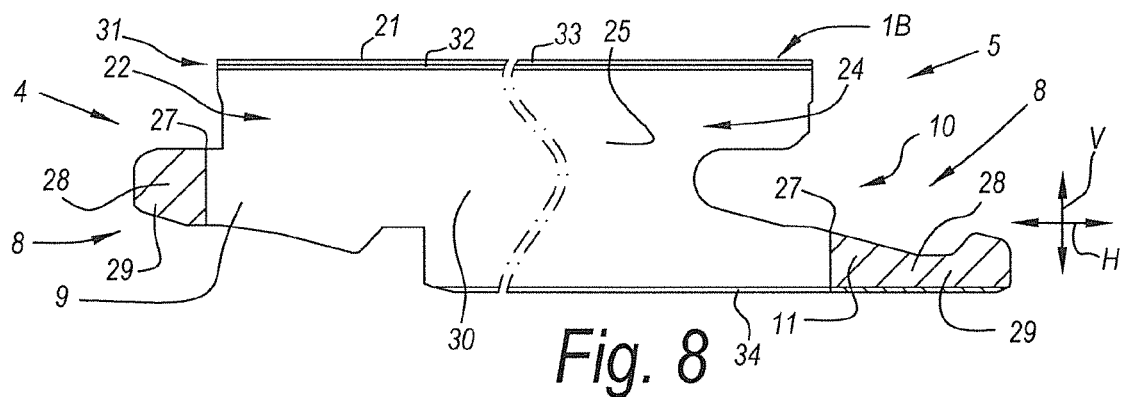
FIG. 8, at a larger scale, represents a view according to the line XIII-XIII represented in FIG. 6.

FIG. 8 further clearly shows that the example relates to laminate floor panels 1, namely floor panels consisting of a core 30 on which a laminate top layer 31 with a printed decor layer 32 and a wear-resistant top layer 33 is provided, and wherein a backing layer 34 is provided on the lower side of the core. It is clear that the invention can be applied with any type of floor panels; so, for example, is it also applied in wooden floor panels, such as prefabricated parquet, or with synthetic material floor panels, such as LVT panels, wherein then other types of top layers are applied. To the person skilled in the art, it is clear that break lines 22 presented here also are applied for these other types of floor panels.

FIG. 8 further shows that the floor panels 1A-1B of the example, at least at one pair of opposite edges 4-5, are provided with mechanical coupling parts 8 allowing to couple two of such floor panels 1A-1B at the respective edges 4-5, wherein in coupled condition a locking is created in a vertical direction V perpendicular to the plane of the panels, as well as in a horizontal direction H perpendicular to the respective edges 4-5 and in the plane of the panels. Such coupling parts 8 may be realized in a plurality of different manners. In the example, they are substantially provided as a tongue-in-groove coupling. From FIG. 1, it is clear that in this case the short edges 6-7, too, are provided with mechanical coupling parts 8. Herein, this may also relate to a locking tongue-in-groove connection of the type represented in FIG. 8. Other possibilities, such as so-called push-lock coupling profiles, are not excluded. Such push-lock coupling profiles allow a locking by means of a downward movement of the panel edges towards each other and are known, for example, from WO 01/75247.

Figure 9:
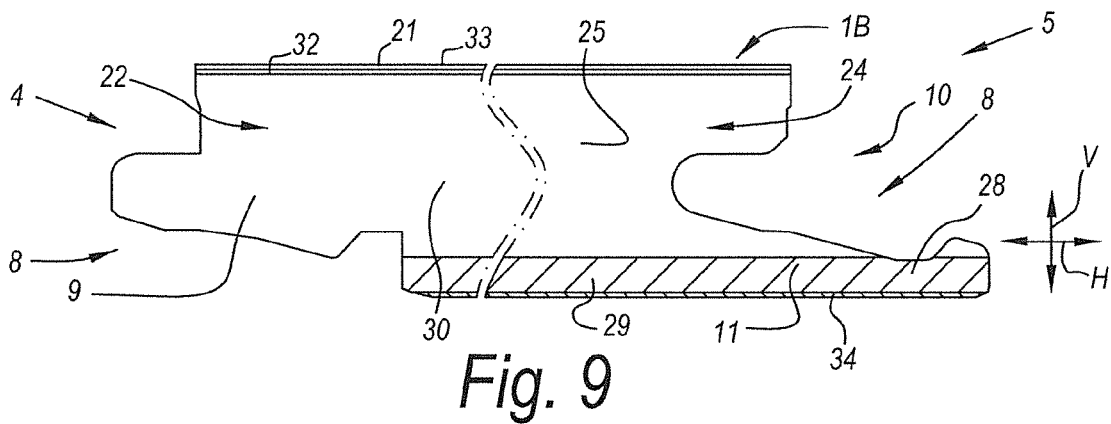
FIGS. 9 to 14, in a same view, represent variants.

FIG. 9 represents another embodiment, wherein the break line 22 is realized as a not through-going slot 24, wherein the useful portion 25 and the excess portion 26 of the floor panel 1B remain connected by means of a remaining connection 29 in the form of a material portion present at the lower side of the floor panel. Preferably, this material portion, such as here, comprises a part of the core 30.

Figure 10:
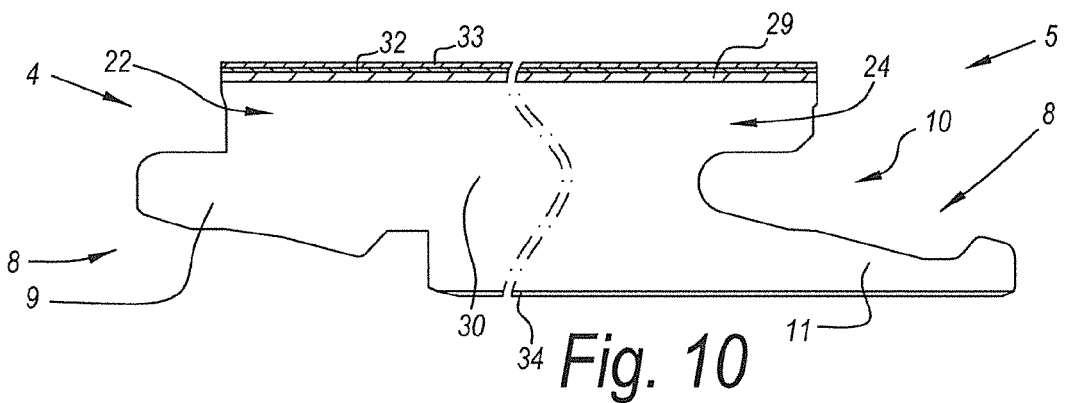

FIG. 10 represents an embodiment, wherein the break line 22 is realized as a not through-going slot 24, wherein the useful portion 25 of the excess portion 26 of the floor panel 1B remain connected by means of a remaining connection 29 in the form of a material portion present at the upper side of the floor panel 1B. Preferably, this material portion, such as here, comprises a part of the core 30.

Figure 11:
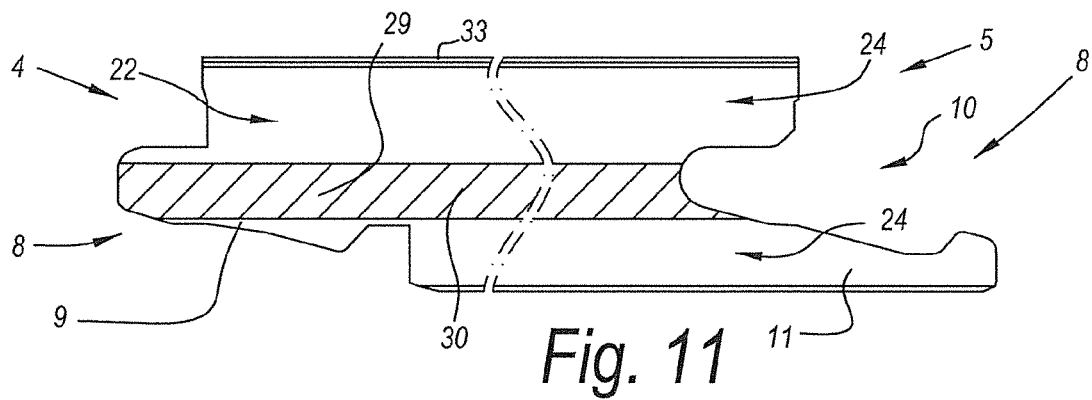

FIG. 11 represents an embodiment, wherein the break line 22 is realized as two not through-going slots 24; one which is realized from the lower side of the floor panel 1B, and one which is realized from the upper side or decorative side 21 of the floor panel 1B. The useful portion 25 remains connected to the excess portion 26 via a remaining connection 29 in the form of a material portion of the core 30.

Figure 12:
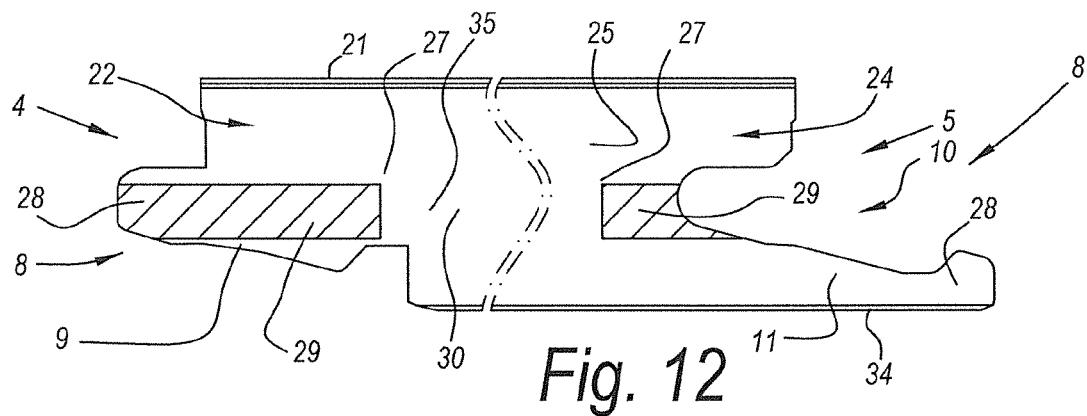

FIG. 12 represents an embodiment, wherein the break line 22 is realized approximately as in FIG. 11, however, with that difference that the slots 24 partially meet each other and thus for a portion 35 form a through-going slot. Herein, the respective portion 35 extends between positions 27, which are situated at two opposite edges 4-5 proximally from the distal ends 28 of the coupling parts 8 present there.

Figure 13:
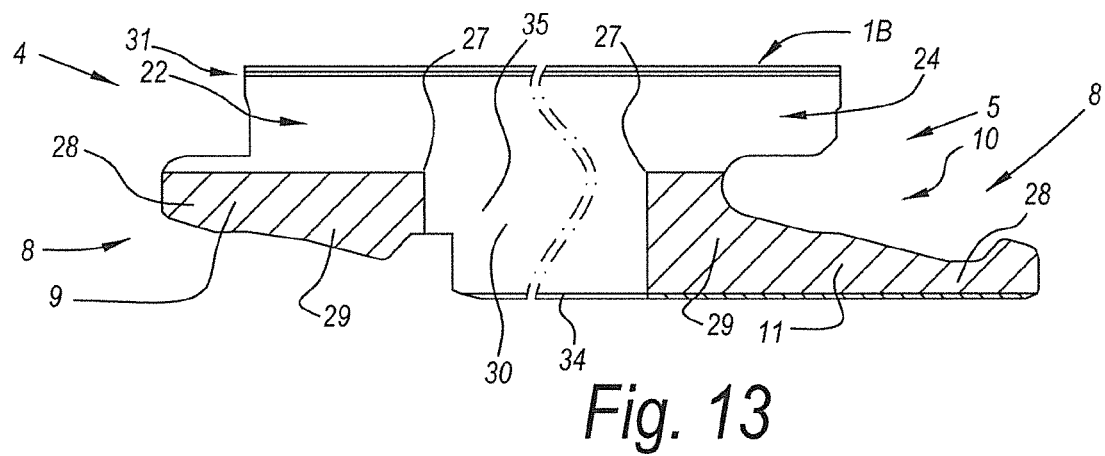

FIG. 13 shows an embodiment, wherein the break line 22 is realized approximately as in FIG. 9, however, with the difference that the slot 24 for a portion 35 is realized as through-going. Herein, the respective portion 35 extends between positions 27, which are situated at two opposite edges 4-5 proximally from the distal ends 28 of the coupling parts 8 present there.

Figure 14:
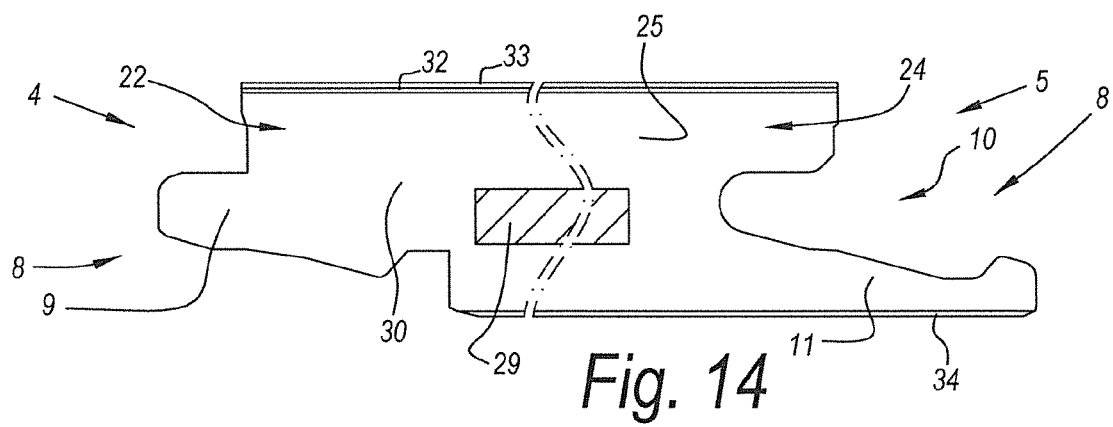

FIG. 14 shows another embodiment approximately such as in FIG. 11, however, wherein the remaining connection 29 is realized as a remaining material portion of the core 30 which is situated centrally, or, in other words, is situated more inward than the profile of the coupling parts 8. In this manner is obtained that the coupling parts 8 are not influenced by the interruption of the remaining connection 29 between the useful portion 25 and the excess portion 26 of the respective second floor panel 1B.

Figure 15:
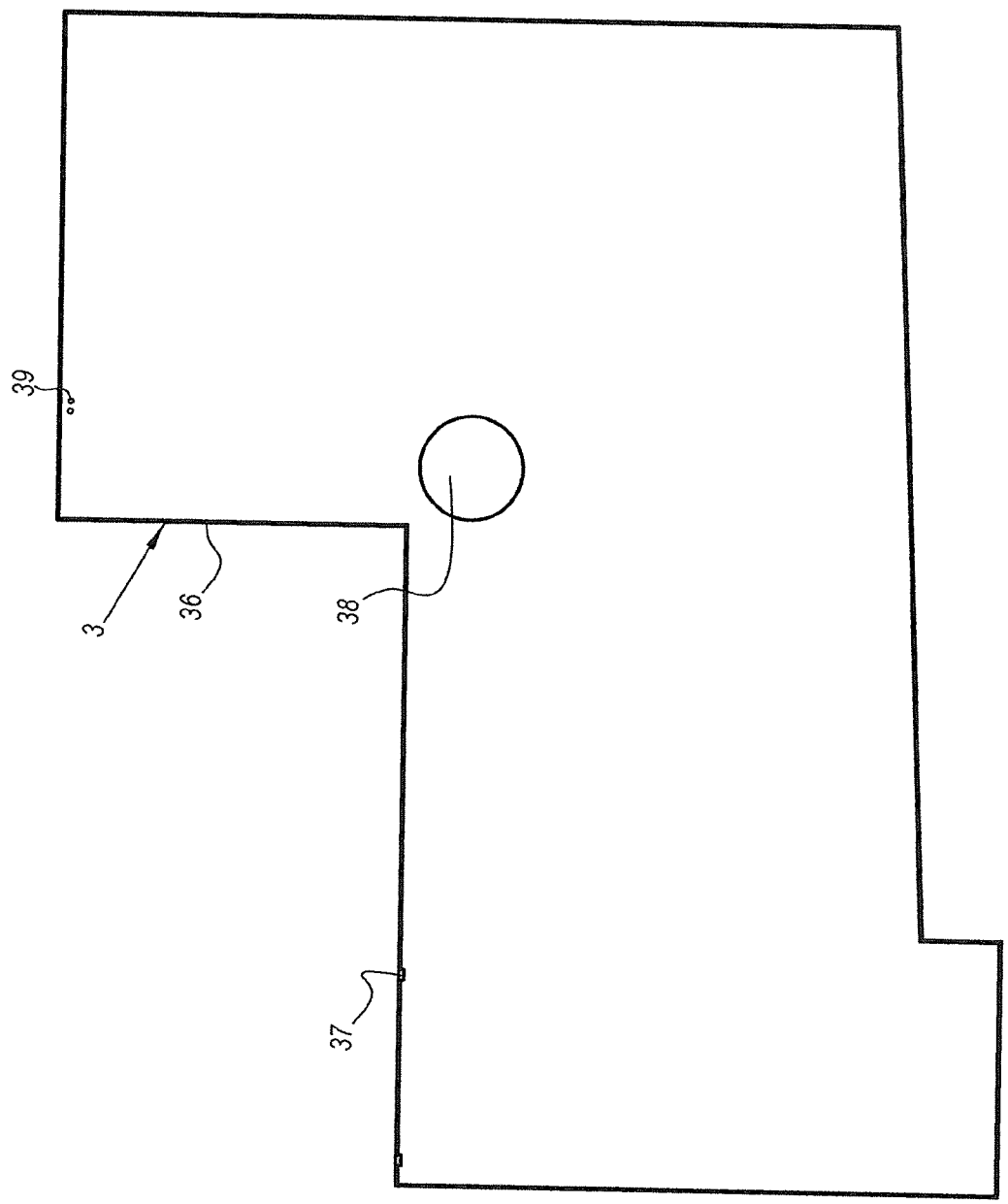
FIG. 15 in top view represents a room to be provided with a floor.

FIG. 15 is a graphical representation of a data set which is generated in accordance with the surface area or surface area plan of a room 3 to be provided with a floor. In this case, the data set comprises data in accordance with the walls 36, frames of doors 37, pillars 38 or support posts, passage openings 39 for conduits and the like. For installing a floor in the room 3, the user has to select a floor product. As an alternative, a floor product can also be presented automatically, or the user can choose among a limited number of presented floor products.

Figure 16:
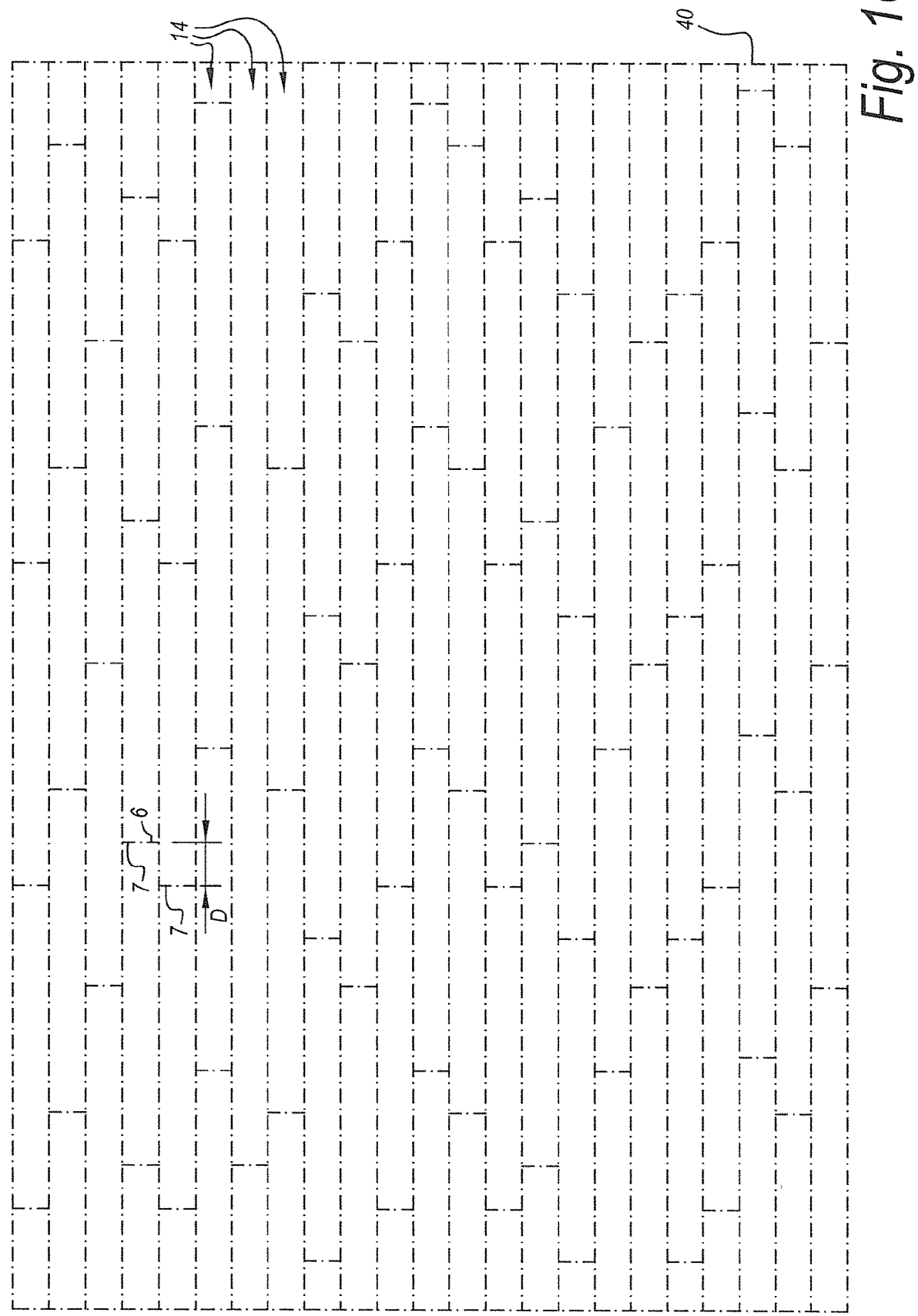
FIG. 16 represents a type of installation plan.

FIG. 16 is an example of a type of installation plan 40 which can be chosen by the user for providing the room of FIG. 15 with a floor. In this case, the installation plan leads to rows 14 of floor panels 1 in random pattern, wherein the minimum distance D between short edges 6-7 of panels 1 in adjacent rows 14 remains larger than a minimum required for the floor product.

Figure 17:
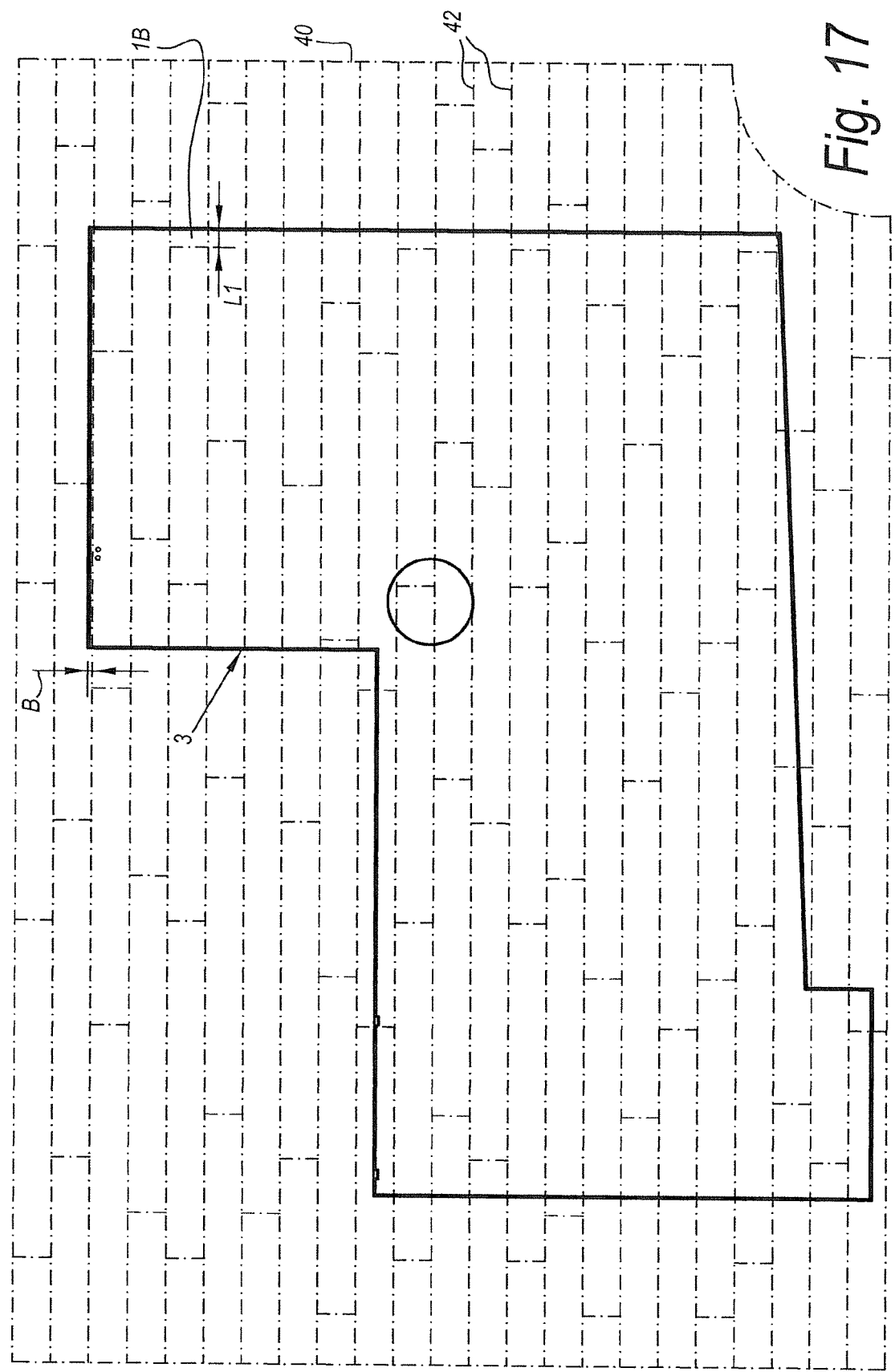
FIGS. 17 and 18 schematically represent a step in a method according to the second aspect of the invention.

FIG. 17 shows that the user, according to the second manner for establishing the final installation plan mentioned in the introduction, can move the aforementioned type of installation plan 40 in a graphical manner over the aforementioned surface area plan. This can be performed, for example, by means of a screen, more particularly a touch-activatable screen or touchscreen, wherein the user can alter the mutual position of the aforementioned transparent layer formed by the type of installation plan 40 and the surface area plan of the room 3 which has to be provided with a floor. Herein, it is possible that the user also chooses the main direction of the rows 14, for example, as here, parallel to the long walls. The computer assesses the mutual position proposed by the user and, in this case, refuses the represented mutual position as not suitable, as, in the example, at least the width B of the row 14 at the top in FIG. 17 does not fulfill the minimum width required for the floor product, and at least because the length L1 of some panels 1B at the right-hand wall does not fulfill the required minimum length.

Figure 18:
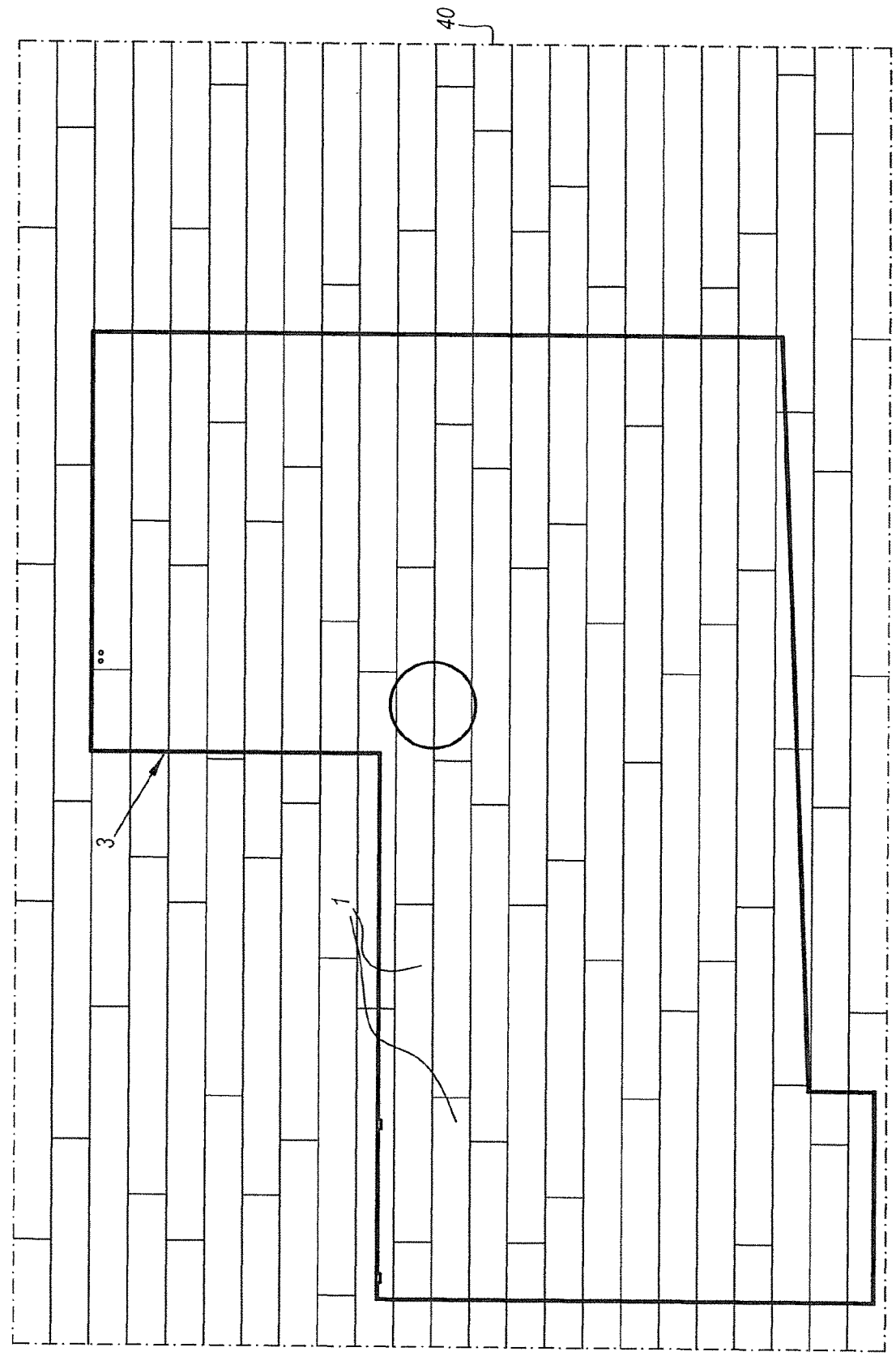

FIG. 18 represents a situation wherein the user has found a mutual position which is assessed by the computer as suitable for providing the respective room with a floor. Herein, the requirements of minimum width and minimum length of the panels 1B are fulfilled everywhere. Having found a suitable installation plan in this case is represented graphically in that the dashed lines of the type of installation plan 40 of FIGS. 16 and 17 have become solid lines. The portion of the type of installation plan 40 which is situated within the contours of the surface area plan forms the final detailed installation plan, as represented in FIG. 2.

FIG. 2 shows that on the basis of the final detailed installation plan the required number of first floor panels 1A as well as the number of the second floor panels 1B with their required adaptation can be calculated, such that the set of floor panels 2 of the first aspect, suitable for installing a floor in the room 3 of FIG. 15, can be composed. The calculation result obtained by means of the herein described method can be applied for controlling a wood processing machine for performing the required adaptations 12, and/or for providing break lines 22 and/or indications 20, such as already described above.

Figure 19:
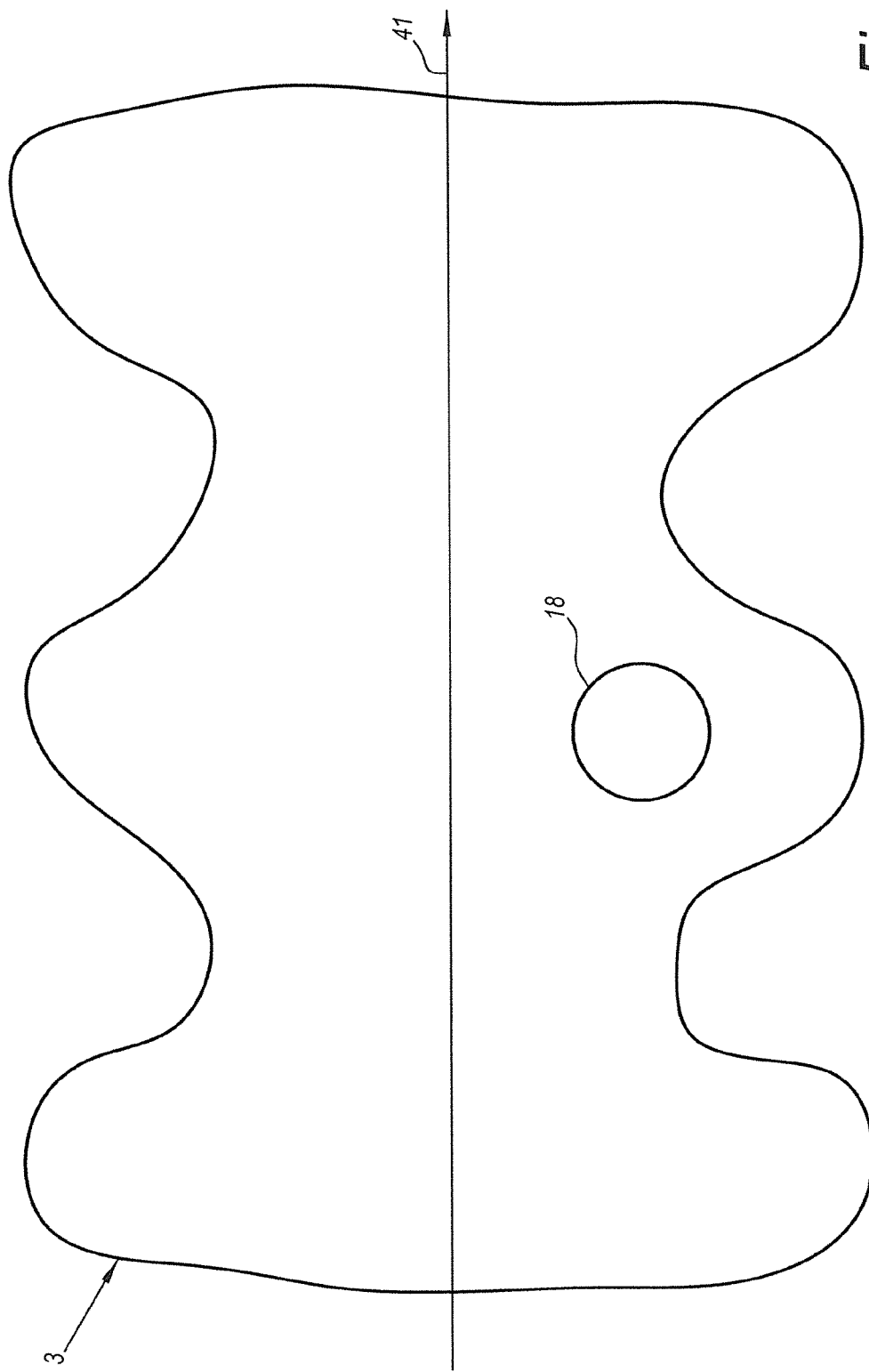
FIG. 19, in a view similar to that of FIG. 15, represents another installation plan of a room to be provided with a floor.

FIG. 19 is a graphical representation of a dataset which is generated in accordance with the surface area plan of a rather theoretical room 3 to be provided with a floor. FIGS. 19 through 22 illustrate a method for generating a detailed installation plan, in this case with a random pattern, for the room of FIG. 19, wherein the particular embodiment mentioned in the introduction is applied to this end. The rather theoretical surface area plan allows illustrating a multitude of possible situations and difficulties when determining a detailed surface area plan and shows that each time a solution can be found.

FIG. 19 shows the desired main direction 41 indicated by the user for the rows 14 of the final installation plan. Such main direction 41 can also be calculated automatically, for example, by determining the main axes of the surface area plan and keeping the main axis with the largest length as the main direction 41. In the not represented case that the surface area plan should have an elliptic shape, in such case automatically the long axis should be taken as the main direction.

Figure 20:
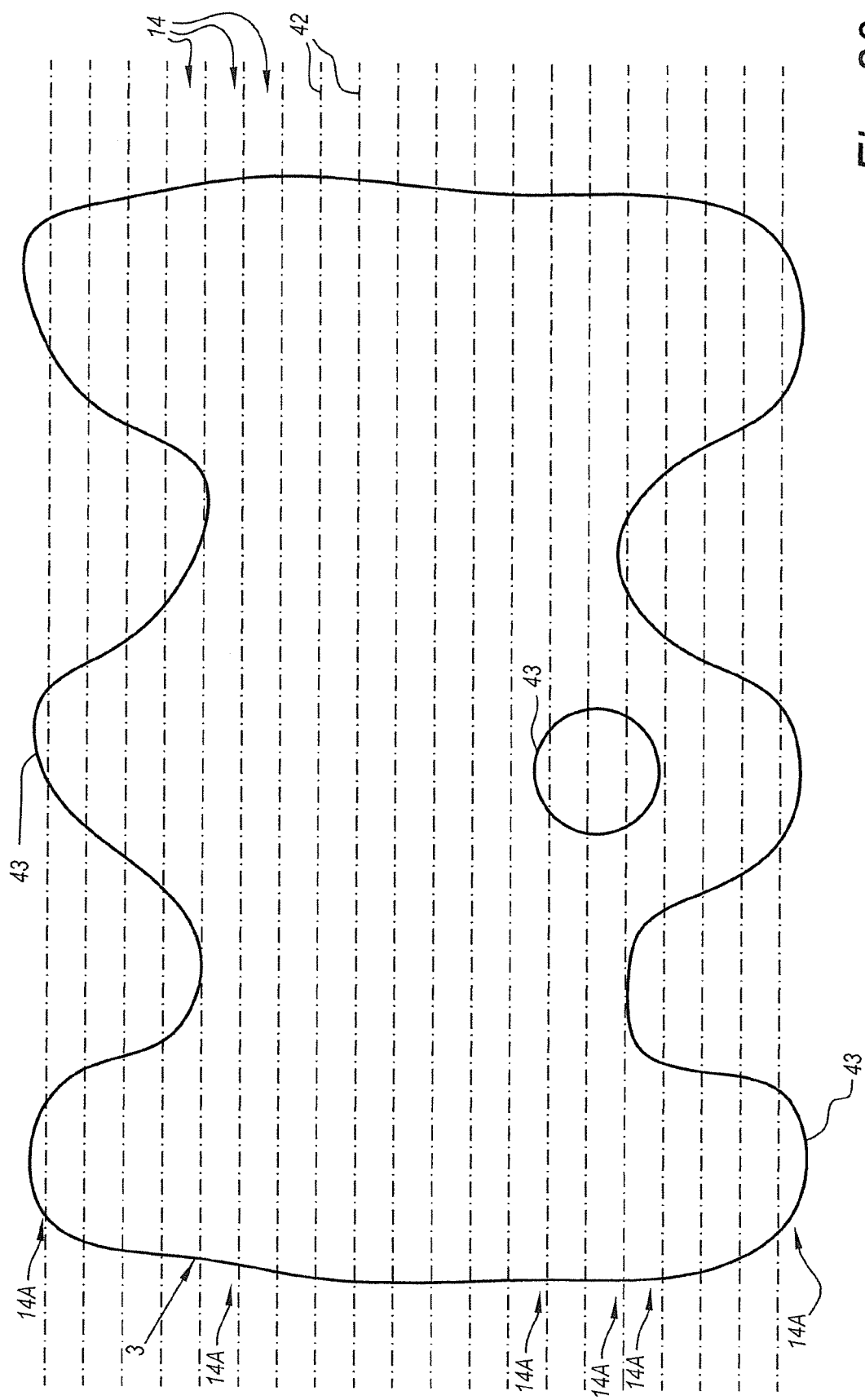
FIGS. 20 to 22 schematically represent some steps in a method with the characteristics of the second aspect of the present invention.

FIG. 20 schematically represents the result of the step of determining the position of the longitudinal edges 42 of panel rows 14. Of course, these longitudinal edges 42 run in the established main direction 41. Their mutual distance M is established by the choice of the floor product. In this case, this relates to a floor product with floor panels 1A of only one common width. The position of the longitudinal edges 42 is performed automatically, such that the average width of the panel rows 14A at the edges 43 is maximum, and wherein the width for each row 14A at such edge 43 over a as large as possible length of the respective row 14A is at least one-half of the width of the panels 1A of the respective floor product.

Figure 21:
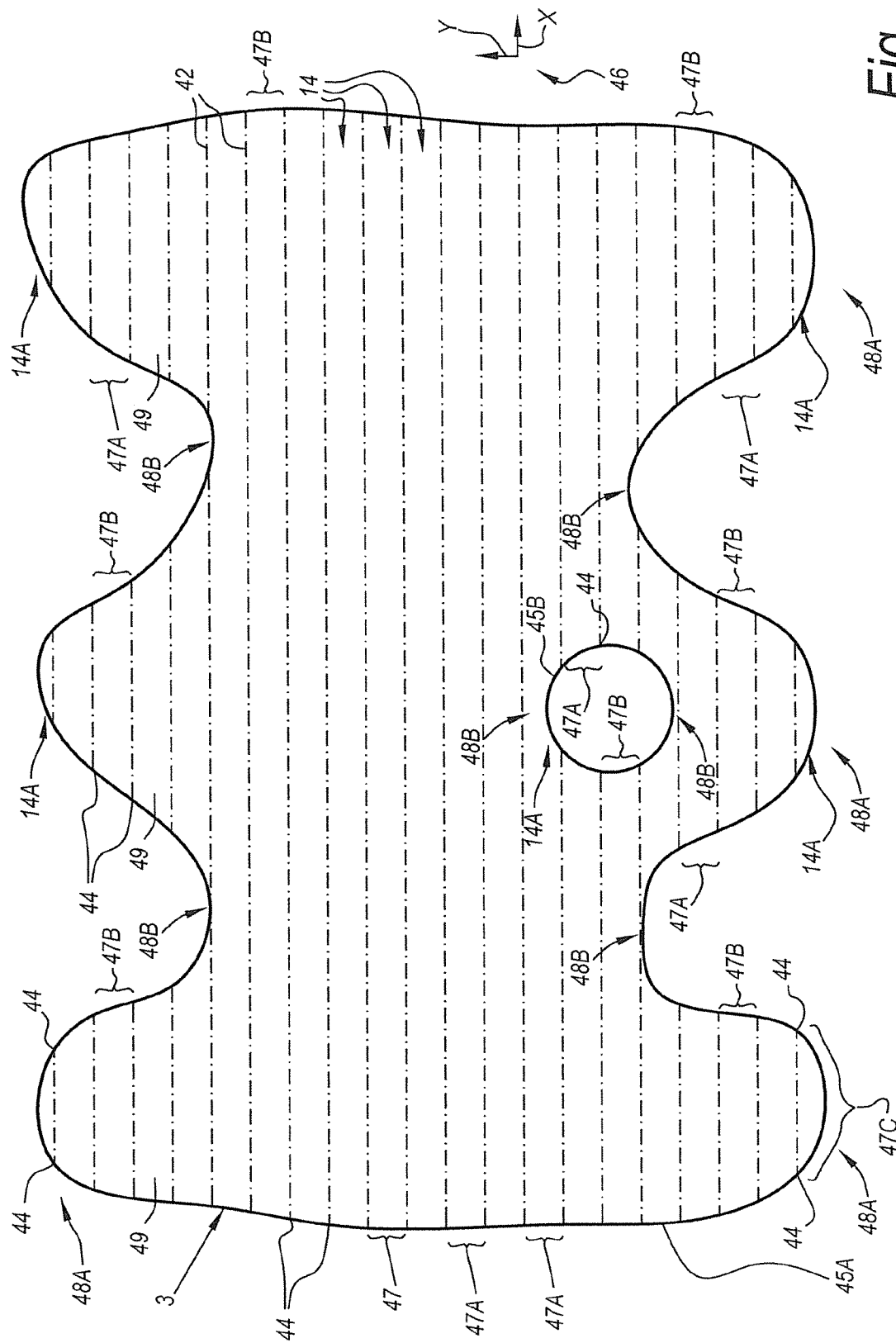

FIG. 21 schematically represents the result of the step of calculating intersections 44 between longitudinal edges 42 of panel rows 14 and the digital surface area plan, more particularly the external borders 45A and preferably also the internal borders 45B or this surface area plan.

On the basis of the aforementioned intersections 44, then starting and stopping positions in panel rows of entire width, as well as convex loops 48A and concave loops 48B, which extend in the same panel row 14, can be determined. To this aim, the borders 45A-45B can be taken into account systematically, for example, as here, in clockwise direction, and the coordinates of two successive intersections 44 can be compared. For calculating in a simple manner, such as here, an orthogonal coordinate system 46 can be applied, of which the X-axis coincides with said main direction 41. In this manner, the transitions 47 between two successive intersections 44 can be classified as follows:

transitions 47A on external borders 45A, wherein the Y-coordinate of the intersections 44 increases, and transitions 47A on internal borders 45B, wherein the Y-coordinate of the intersections 44 decreases. Such transition 47A relates to a starting position of a row 14 of complete width, which is started with a second floor panel which can be shortened at the left hand side;

transitions 47B on external borders 45A, wherein the Y-coordinate of the intersections 44 decreases, and transitions 47A on internal borders 45A, wherein the X-coordinate of the intersections 44 increases. Such transition 47B relates to an end position of a row 14 of complete width, which is ended with a second floor panel which can be shortened at the right hand side;

transitions 47C on external or internal borders 45A-45B, wherein the Y-coordinate of the intersections 44 does not change. Such transition relates to a loop 48A-48B. When on an external border 45A, between the respective intersections 44, with an increasing X-coordinate, it is switched from an increasing Y-coordinate to a decreasing Y-coordinate, or when, with a decreasing X-coordinate, it is switched from a decreasing X-coordinate to an increasing Y-coordinate, this relates to a convex loop 48A. When this relates to an internal border 45B, with such coordinate changes it is a concave loop 48B. When on an external border 45A, between the respective intersections 44, with an increasing X-coordinate, it is switched from a decreasing Y-coordinate to an increasing Y-coordinate, or when, with a decreasing X-coordinate, it is switched from an increasing Y-coordinate to a decreasing Y-coordinate, this relates to a concave loop 48B. When this relates to an internal border 45B, with such coordinate changes it is a concave loop 48A. Convex loops 48A lead to floor panels 1B, the width of which is shortened. Concave loops 48B lead to floor panels 1B which as such form part of a larger adjacent row 14, which extends between a transition 47A and transition 47B, adjacent to the transition 48B concerned.

As aforementioned, the borders 45A and 45B herein above are taken into account in clockwise direction. It is evident that the borders in general can be taken into account in any order, for example, counterclockwise, wherein then in fact the above-stated classification has to be performed on the basis of adapted logics. It is also possible that different borders of the same surface area plan are taken into account in another manner, for example, external borders 45A in clockwise direction and internal borders 45B in counterclockwise direction. The axis system, too, can be defined in another manner, such that then another logic has to be applied for the above classification. Such adaptations are within the scope of the person skilled in the art.

Transitions 47A and 47B can simply be linked to the same row 14 by comparing their Y-coordinates. When, such as here, a plurality of transitions 47A-47B with common Y-coordinates is present, those are ordered according to X-coordinate, such that independent row portions 49 are obtained with their separate starting transition 47A and stopping transition 47B. By "independent" is meant that the final embodiment of such row portion 49 can be performed independently from the other row portions 49 in the same row 14. This insight is an important difference between the present method and the method illustrated by means of FIGS. 15 to 18 and allows reducing material loss.

Figure 22:
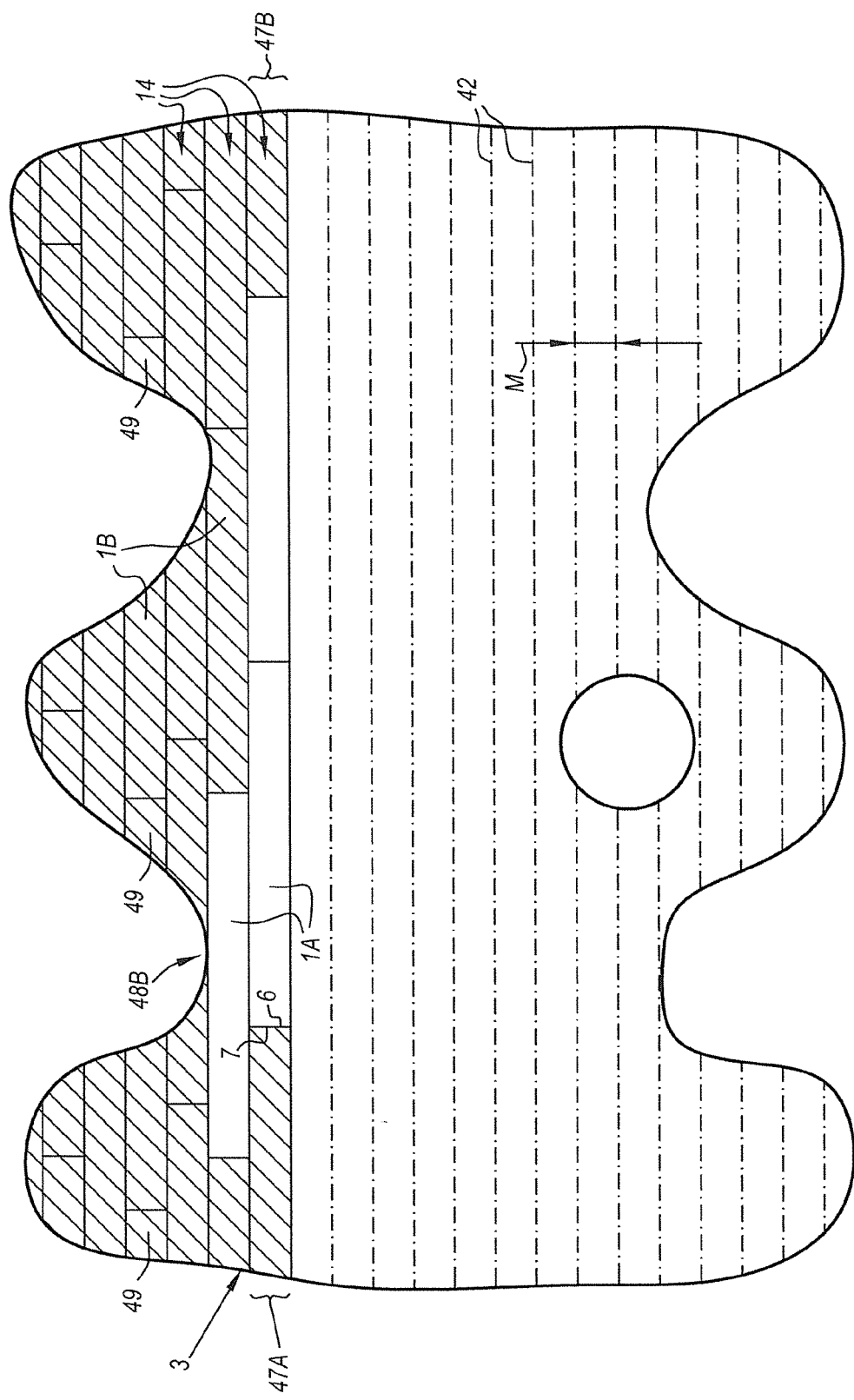

FIG. 22 represents that the computer proposes first floor panels 1A and second floor panels 1B between each of the transitions 47A and 47B, or in other words in each row 14 or independent row portion 49, while taking into account the desired limitations, such as the minimum distance D to be kept between short edges in adjacent rows 14, and with possible concave loops 48B, which can extend in the respective row 14 or row portion 49. The convex loops 48A as such can be filled in separately with second floor panels 1B. As mentioned in the introduction, the first floor panels 1A and the second floor panels 1B each time can be based on a database of available panels or panel portions.

When each transition 47A-47B-47C has been processed, the detailed installation plan is complete. The obtained detailed installation plan then is applied further, such as already explained above, for example, for controlling of wood-processing machines for performing the required adaptations 12, and/or for providing break lines 22 and/or indications 20. It is clear that in the present example the required adaptations 12 each time consist of realizing the portion of the internal border 45B or external border 45A at the location of the transitions 47A-47B-47C concerned.

Figure 23:
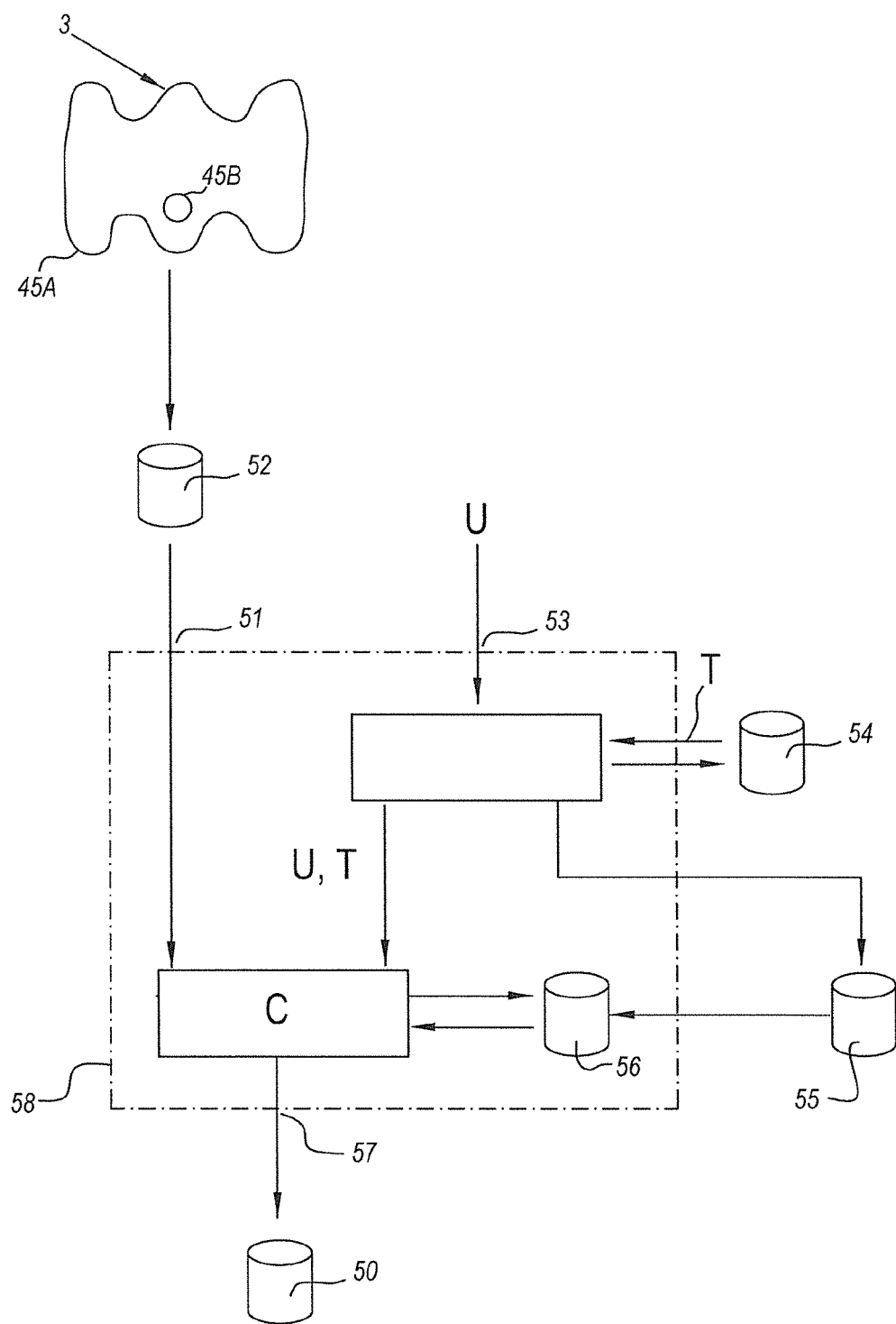
FIG. 23 represents a workflow for realizing data suitable for manufacturing a set of floor panels with the characteristics of the first aspect.

FIG. 23, strongly schematically, also represents a preferred workflow for generating data 50 suitable for composing a set of floor panels with the characteristics of the first aspect. As a first input 51, a dataset 52 is used in accordance with the surface area plan of a room 3 to be provided with a floor. This dataset 52 preferably comprises at least information, preferably the coordinates, for example, in an orthogonal axis system, over the position of external and/or internal borders 45A-45B. As a second input, use is made of information U, for example over the requests of the user and the geographical location of the installation. With the requests of the user, this may relate, for example, to the desired floor product, the desired installation pattern, for example, random pattern, and the like. On the basis of this information U, one the one hand, information T relating to technical limitations for the installation is retrieved from a database 54, and, on the other hand, a database 55 of available floor panels of the chosen floor product is selected. The database 55 is applied for supplying a temporary database 56 of available floor panels 1A in respect to providing the room 3 concerned with a floor. Such database 56 can comprise, for example, data relating to the real length of each floor panel. This latter is particularly useful in the case of a floor product with panels 1A of random length.

The database 56 of first floor panels 1A, the information T and information U then are applied for the calculation C of the detailed surface area plan. This may relate, for example, to a calculation C as explained by means of FIGS. 19 to 22. In this case, during the calculation C each time an available floor panel is retrieved from the database 56 for adding a first floor panel 1A or for realizing a second floor panel 1B. In this last case, the excess portion 26 of the second floor panel 1B is put back into the database 56, such that it is available for a possible realization of a subsequent second floor panel 1B.

As an output 57 finally data 50 is created, suitable for composing a set of floor panels 2, which is suitable for installing a floor in the room 3. These data 50 comprise at least information relating to the required adaptations 12 of the second floor panels 1B. The data 50 can comprise, for example, for each second floor panel 1B the coordinates of the contour of the adaptation 12. Further, the data 50 can also comprise information over the detailed installation plan; so, for example, may the data 50 comprise the intended position of each first and second floor panel 1A-1B in the room 3.

In FIG. 23, the rectangle in dash-dotted line 58 represents processes which preferably are performed internally in a computer.

It is clear that the present invention also relates to microprocessors which are programmed for generating a detailed installation plan for a room 3 to be provided with a floor and/or for generating data 50 suitable for composing a set of floor panels 2 which are suitable for installing a floor in a room 3, and/or to digital data media comprising such program or significant parts thereof.

The present invention is in no way limited to the herein above-described embodiments; on the contrary, such sets of floor panels and methods for composing the same can be realized in various manners without leaving the scope of the present invention.

The invention claimed is:

1. A set of floor panels configured to form a floor covering for a room having a predetermined floor shape, the set of floor panels comprising:
   a plurality of first floor panels, each of said first floor panels having a predetermined panel shape and a predetermined dimension common to said first floor panels; and
   one or more second floor panels each having an adaptation configured to modify the second floor panel from the predetermined panel shape or the predetermined dimension of the first floor panels;

wherein the plurality of first floor panels and the one or more second floor panels are configured to couple together to form said floor covering and form the predetermined floor shape of the room;

wherein a plurality of said one or more second floor panels comprising the adaptation are packaged together in a packaging unit with the first set of floor panels;

wherein this unit also comprises excess pieces created by said adaptation; and wherein each of said one or more second floor panels having the adaptation and a corresponding one of the excess pieces add to the predetermined panel shape and predetermined dimension common to each floor panel of said plurality of first floor panels.

2. The set of floor panels of claim 1, wherein the set of floor panels can be applied without further adaptations for installing a floor in said room.

3. The set of floor panels of claim 1, wherein said adaptation consists of a shortening in length and/or width of the one or more second floor panels.

4. The set of floor panels of claim 1, wherein said adaptation consists of removing protruding portions on one or more edges of the one or more second floor panels, wherein at least one edge of the second floor panels is removable resulting in the second floor panels having only three or fewer edges including a coupling part.

5. The set of floor panels of claim 1, wherein said adaptation consists of providing a contour on one or more edges of the one or more second floor panels, wherein this contour follows a course of a wall of said room.

6. The set of floor panels of claim 1, wherein said adaptation consists of providing recesses and/or adaptation pieces for a passage of conduits.

7. The set of floor panels of claim 1, wherein the adaptation consists an excess portion of the one or more second panels configured to be removed from a respective one of said one or more second floor panels, said excess portion and a remaining portion from which the excess portion is removable of each of said one or more second floor panels combine to form the predetermined panel shape and predetermined dimension of said first set of floor panels.

8. A set of floor panels configured to form a floor covering for a room having a predetermined floor shape, the set of floor panels comprising:

a plurality of first floor panels, each of said first floor panels having a predetermined panel shape and a predetermined dimension common to said first floor panels; and one or more second floor panels each having an adaptation configured to modify the second floor panel from the predetermined panel shape or the predetermined dimension of the first floor panels;

wherein the plurality of first floor panels and the one or more second floor panels are configured to couple together to form said floor covering and form the predetermined floor shape of the room;

wherein the adaptation consists a break line between an excess portion and a remaining portion of a respective one of said one or more second floor panels.

9. The set of floor panels of claim 1, wherein the one or more second floor panels have four sides, said adaptation consists of the one or more second floor panels having three or fewer of said four sides having coupling parts.

10. A method for composing a set of floor panels for installing a floor in a room, the set of floor panels configured to form a floor covering for a room having a predetermined floor shape, the method comprising the steps of:

generating a data set in accordance with at least a surface area of said room, establishing an installation plan suitable for the room, producing the set of floor panels, which, according to the installation plan, comprising a plurality of first floor panels, each of said first floor panels having a predetermined panel shape and predetermined dimension common to one another, and one or more second floor panels each having an adaptation modifying or arranging the second floor panel to be modified from the predetermined panel shape or the predetermined dimension of the first floor panels;

wherein the plurality of first floor panels and the one or more second floor panels are configured to couple together to form said floor covering and form the predetermined floor shape;

wherein a plurality of said one or more second floor panels comprising the adaptation are packaged together in a packaging unit with the first set of floor panels, and wherein said packaging unit also comprises excess pieces created by said adaptation;

wherein each of said one or more second floor panels having the adaptation and a corresponding one of the excess pieces add to the predetermined panel shape and predetermined dimension common to each floor panel of said plurality of first floor panels.

11. The method of claim 10, wherein the step of establishing the installation plan is performed by a computer, wherein the computer, on a basis of said data set, taking desired limitations into account, proposes the installation plan.

12. The method of claim 10, wherein the step of establishing the installation plan is performed by a computer, wherein the computer, on a basis of said data set, taking desired limitations into account, assesses installation plans which were provided by a user in a graphical manner over a presentation of the surface area plan.

13. A method for composing a set of floor panels configured for installing a floor covering for a room having a predetermined floor shape, wherein the set of floor panels comprises a plurality of first floor panels, each of said first floor panels having a predetermined panel shape and predetermined dimension common to one another, and one or more second floor panels each having an adaptation modifying or arranging the second floor panel to be modified from the predetermined panel shape or the predetermined dimension of the first floor panels; wherein the plurality of first floor panels and the one or more second floor panels are configured to couple together to form said floor covering and form the predetermined floor shape;

wherein the method comprises the steps of generating a data set in accordance with at least a surface area plan of said room, establishing an installation plan suitable for the room, producing the required floor panels, which, according to the established installation plan, comprise the adaptation, and at least a required quantity of floor panels with the predetermined floor shape and the predetermined dimension;

wherein a plurality of said one or more second floor panels comprising the adaptation are packaged together in a packaging unit with the first set of floor panels, and wherein said packaging unit also comprises excess pieces created by said adaptation;

wherein each of said one or more second floor panels having the adaptation and a corresponding one of the excess pieces add to the predetermined panel shape and predetermined dimension common to each floor panel of said plurality of first floor panels.

14. The method of claim 13, wherein the step of establishing the installation plan is performed by a computer, wherein the computer, on a basis of said data set, taking desired limitations into account, proposes an installation plan.

15. The method of claim 13, wherein the step of establishing the installation plan is performed by a computer, wherein the computer, on the basis of said data set, taking desired limitations into account, assesses installation plans which were provided by the user in a graphical manner over a presentation of the surface area plan.

16. The method of claim 13, wherein a computer, on a basis of said data set, proposes a detailed installation plan for the room, wherein the method comprises at least the following steps:

the step of determining the main direction of the panel rows, wherein this main direction is entered by the user;

the step of determining the position of longitudinal edges of panel rows;

the step of calculating intersections between said longitudinal edges of panel rows and a digital surface area plan, the external, or the internal, borders of this surface area plan;

the step of identifying, on the basis of said intersections, starting and stopping positions in panel rows of complete width, as well as of concave and convex loops extending in the same panel row;

the step of presenting first and second floor panels between the starting and stopping positions in each panel row, taking into account desired limitations and possible concave loops situated in the respective panel row;

the step of presenting the one or more second floor panels at a location of said convex loops, if present, also taking desired limitations into account.

17. The method of claim 16, wherein the step of proposing panels is performed starting from each time an available floor panel from a database of available floor panels or floor panel parts, taking into account the individual length of the available floor panels or parts.

18. The method of claim 17, wherein said database is provided with data relating to excess portions of the one or more second floor panels.

19. The method of claim 14, wherein said desired limitations comprise at least a distance which minimally has to be kept between short edges of the one or more second floor panels in adjacent rows.

20. A set of floor panels configured to form a floor covering for a room having a predetermined floor shape, the set of floor panels comprising:

a plurality of first floor panels, each of said first floor panels having a predetermined floor shape and a predetermined dimension common to said first floor panels; and one or more second floor panels each having an adaptation configured to modify the one or more second floor panels from the predetermined panel shape or the predetermined dimension of the first floor panels;

wherein the adaptation comprises a break line or dividing line configured to demarcate an excess portion from the one or more second floor panels and a remaining portion of the one or more second floor panels such that the excess portion is removable from the remaining portion, the remaining portion having a shape or dimension smaller than the predetermined floor shape or predetermined dimension of the plurality of first floor panels;

wherein the plurality of first floor panels and the remaining portion of one or more second floor panels are configured to couple together to form said floor covering and form the predetermined floor shape of the room.

* * * * *